US007724265B2

(12) United States Patent
Takada et al.

(10) Patent No.: US 7,724,265 B2
(45) Date of Patent: May 25, 2010

(54) DISPLAY DRIVER

(75) Inventors: Naoki Takada, Yokohama (JP); Yasuyuki Kudo, Fujisawa (JP); Goro Sakamaki, Fuchu (JP)

(73) Assignee: Renesas Technology Corp., Tokyo (JP)

( * ) Notice: Subject to any disclaimer, the term of this patent is extended or adjusted under 35 U.S.C. 154(b) by 872 days.

(21) Appl. No.: 11/545,535

(22) Filed: Oct. 11, 2006

(65) Prior Publication Data

US 2007/0091115 A1 Apr. 26, 2007

(30) Foreign Application Priority Data

Oct. 13, 2005 (JP) ............................ 2005-299332

(51) Int. Cl.

| | |
|---|---|
| ***G06F 3/038*** | (2006.01) |
| ***G09G 5/00*** | (2006.01) |
| ***G09G 5/02*** | (2006.01) |
| ***H04N 7/01*** | (2006.01) |
| ***H04N 11/06*** | (2006.01) |
| ***G03F 3/08*** | (2006.01) |
| ***G06K 9/00*** | (2006.01) |

(52) U.S. Cl. ....................... 345/589; 345/204; 345/591; 345/604; 345/690; 348/441; 348/469; 348/48; 348/761; 358/518; 358/523; 382/162; 382/166; 382/254; 382/276

(58) Field of Classification Search ................. 345/581, 345/589, 591, 593, 600–603, 604, 204, 690, 345/63, 87–88, 660, 426–428, 590, 605–606, 345/617–619, 670–671, 548–549, 531, 555, 345/72; 348/383, 386, 396, 426.1, 441–445, 348/453, 467, 469, 488, 555–558, 496, 572, 348/739, 751, 761; 358/515–525
See application file for complete search history.

(56) References Cited

U.S. PATENT DOCUMENTS

| | | | | |
|---|---|---|---|---|
| 6,335,760 | B1 * | 1/2002 | Sato | 348/397.1 |
| 6,542,143 | B1 * | 4/2003 | Ozawa | 345/98 |
| 2006/0010404 | A1 * | 1/2006 | Mamba et al. | 715/864 |

FOREIGN PATENT DOCUMENTS

| | | |
|---|---|---|
| JP | 2003-123062 | 4/2003 |
| JP | 2005-055824 | 3/2005 |

* cited by examiner

*Primary Examiner*—Sajous Wesner
(74) *Attorney, Agent, or Firm*—Antonelli, Terry, Stout & Kraus, LLP.

(57) ABSTRACT

A YUV format to be stored in a memory is selected from A or B by a format judging unit for RGB data that is the input output display data of a memory unit, based on the comparison between chrominance (U, V) difference information on horizontal two pixels and the threshold values of U difference and V difference to be resistor-set at a format judging unit. The YUV data and information of A or B that are YUV format-converted at the format conversion unit are stored in the memory. The selection of the YUV format of A or B is, when the chrominance difference information is small as compared with the threshold value the format is YUV 422 (B conversion), and when it is large the format is that the low order bits of Y, U, V of each pixel are reduced (A conversion).

18 Claims, 14 Drawing Sheets

FIG. 2

200

| U DIFFERENCE THRESHOLD RESISTOR VALUE | U DIFFERENCE THRESHOLD: Tu |
|---|---|
| 2'b00 | 4 |
| 2'b01 | 8 |
| 2'b10 | 16 |
| 2'b11 | 32 |

201

| V DIFFERENCE THRESHOLD RESISTOR VALUE | V DIFFERENCE THRESHOLD: Tv |
|---|---|
| 2'b00 | 4 |
| 2'b01 | 8 |
| 2'b10 | 16 |
| 2'b11 | 32 |

DISPLAY DRIVER

CROSS-REFERENCE TO RELATED APPLICATION

The present application claims priority from Japanese Patent Application No. JP 2005-299332 filed on Oct. 13, 2005, the content of which is hereby incorporated by reference into this application.

TECHNICAL FIELD OF THE INVENTION

The present invention relates to an active matrix display device such as a TFT liquid crystal and the like, and in particular, it relates to technologies on lower cost, reduction in image degradation, and high image quality by the processing such as compression of display data and the selection and conversion and the like of a data format stored in a memory in a display drive circuit of the display device.

BACKGROUND OF THE INVENTION

In the active matrix display device such as the TFT liquid crystal display and the like, with respect to an LCD driver (drive circuit) particularly for a mobile use such as a portable telephone and the like, an LCD driver containing a frame memory is in widespread use, which aims at low power consumption through elimination of data communications between a CPU (MPU) and the LCD driver at the time of displaying a still image or a standby screen.

For the still image, the standby screen, and the like, since one frame data can be carried by the frame memory of the LCD driver, the same data from the frame memory is read, so that display can be made without performing data communications between the CPU and the LCD driver.

However, when the frame memory is carried by the LCD driver, a chip size becomes large, and the cost thereof increases. On the other hand, the demand for a low cost system is generally advancing in the market, and chip size saving of the LCD driver is solicited. Hence, the LCD driver having no cost increase or a slight cost increase when carrying the frame memory is demanded in the market.

Hence, in the LCD driver of the conventional art, a display data is RGB-YUV converted (that is, converted from an RGB format to a YUV format), and particularly, by storing the display data in the memory (frame memory) by a YUV 422 format, in other words, by reducing the amount of the memory-stored data by compression, the chip size saving is realized. Note that, Y indicates luminance, and U and V indicate chrominance.

In the following, for comparison with the present invention, the system of a display drive (system and method) in the conventional liquid crystal display device (LCD) will be briefly described below. In the conventional method, in the liquid crystal display device, before storing the display data in the memory, the inputted display RGB data of 24 bits are serial/parallel converted, and the data of RGB 24 bits×2 for the parallelized horizontal two pixels portion is converted by YUV data, and is converted into a YUV 422 format.

Here, the YUV 422 format is a format which has luminance (Y) information for every one pixel without reducing the same, and averages the chrominance (U, V) information is a format averaged in the horizontal two pixels. In this YUV 422 format, the reason why the chrominance (U, V) information of the horizontal two pixels is averaged is because of the visual characteristic hard to be judged as the image degradation for human eyes.

As a result, the input display data is 48 bits for every horizontal two pixels, while in the YUV 422 format, it is possible that the input display data is 32 bits for every horizontal two pixels. Thus, the data amount-stored in the memory can be relatively reduced by about 30 percent.

In relation to the YUV processing (YUV format conversion processing) for the display data, Japanese Patent Application Laid-Open No. 2003-123062 and Japanese Patent Application Laid-Open No. 2005-055824 can be cited.

In Japanese Patent Application Laid-Open No. 2003-123062, a plurality of different tables performing YUV-Y'U'V' conversion processing are provided in an LCD control unit, and from among these conversion tables, one table is selected so as to perform the YUV-Y'U'V' conversion. As a result, the YUV-Y'U'V' conversion matching the display image is performed, and after that, the YUV-RGB conversion processing is performed.

In Japanese Patent Application Laid-Open No. 2005-055824, an RGB data is converted into a YUV data, and the converted YUV format is separated into a luminance component and a chrominance component, and by giving consideration to the characteristic of a color space of the input data, data compression processing is performed. At this time, the luminance (Y) data realizes a lossless compression by Huffman coding processing (that is, compression ratio is changed depending on data), and the chrominance (U, V) data realizes reduction of information amount of the display data by performing quantizing lossless compression after reducing the information amount.

SUMMARY OF THE INVENTION

However, according to the technology of the memory-stored data compression of the conventional method, in the case of the YUV 422 format, since the chrominance (U, V) information of the horizontal two pixels is averaged, in proportion as the data differences of these pieces of the information increase, an error difference with the original data becomes large, and thus, the image degradation becomes remarkable.

As an example of the display image with remarkably observed image degradation remarkably observed, a case can be cited where color letters/lines and the like are displayed on background colors such as white, grey. In this case, due to error differences of the chrominance (U, V) data, it is conceivable that a change or feathering of the color occurs in the boundary lines between the background colors and the color letters/lines.

With respect to Japanese Patent Application Laid-Open No. 2003-123062, since the selection of the plurality of tables is set out externally and the YUV-Y'U'V' conversion is not performed based on the display data, the display data of all sorts cannot be handled. Beside, having a plurality of tables leads to the increase in the chip size.

In the case of Japanese Patent Application Laid-Open No. 2005-055824, since the compression ratio changes depending on the data, a memory size in the worst case of the compression ratio is required as a memory. In addition, there is no mention made on the view point of the compression when the data is stored in the memory.

Based on the above, an object of the present invention is to provide a technology of a display drive circuit in which, when display data is stored in the memory in the display drive circuit such as the liquid crystal display device and the like, the compression (format conversion) of the data is performed by the YUV format and the like so as to reduce the data amount, thereby realizing a low cost through the reduction of a memory size, and at the same time, the image degradation in a specific display image which is a problem of the conventional art (memory compression system by the conventional YUV format), for example, the image degradation such as feathering and the like observed in the color letters/lines and the like is reduced, so that a high image quality can be realized.

The typical ones of the inventions disclosed in this application will be briefly described as follows. To achieve the object above, the display drive circuit of the present invention is characterized by being applied to a display driver for the display device having a memory (storage circuit) for storing the display data in a built-in form and the like, and comprising technological means as described below.

The present drive circuit comprises means for a processing for compressing the data stored in the memory into the YUV format and the like based on the input data, that is, performing a processing for reducing the memory-stored data amount by performing the format conversion of the display data. This means comprises, for example, means (format conversion unit 113 and the like) for performing a plurality of conversions of various types different in the data reduction method and the like, which perform, for example, the conversion from the RGB format to the YUV format (including the YUV-Y'U'V' format conversion), and means (format determination unit 112 and the like) for judging a format, a conversion method, and the like to be stored in the memory particularly according to the chrominance (U, V) information and the data thereof, and selecting a format from the plurality of types of the formats. By these means, the memory-stored data amount is reduced, thereby realizing both of a low cost system and a reduction in the image degradation.

The present invention pays attention to the fact that, in the conventional YUV 422 format conversion, for example, the chrominance data is averaged in the display image having large difference of the chrominance information between the horizontal two pixels, so that an error with the original chrominance data becomes large.

In the present invention, when the chrominance difference information on a plurality of original adjacent pixels (before conversion) is large, a plurality of low order bits of the Y, U, V data of each pixel are reduced (thinned out), so that the data becomes YUV format data small in the errors. As a result, the image degradation can be reduced.

The display drive circuit of the present invention has, for example, to be more in detail, the following configuration. The present display drive circuit comprises a data compression circuit for converting the display data of a first format inputted externally into a second format; a storage circuit for storing the display data of the second format; a data expansion circuit for converting the display data of the second format into the first format (or other third format); a voltage generating circuit for generating a plurality of voltages (gradation voltages) corresponding to a plurality of gradations which the display data of the first format shows; and a voltage selecting circuit for selecting the voltage according to the display data of the first (or third) format from the plurality of voltages, and is a circuit for outputting the voltage according to the display data to display elements of the display panel. In the present circuit, the conversion to the second format in the data compression circuit has a plurality of types different in the data amount and the like, and according to information on the plurality of adjacent pixels in the display data, particularly, according to chrominance information on each pixel in the display data of the YUV format once converted into the YUV, any one of the second formats of the plurality of types are selected, and the display data converted into the selected second format is stored in the storage circuit.

The present display drive circuit further comprises a register circuit for storing the set values (taken as Tu and Tv, respectively) of threshold values (comparison value and reference value) for comparing with the pixel components of the display data for the selection. The conversion into the second formation is selected from any of the plurality of types according to a size relationship corresponds to the comparison between the pixel component of the display data and the threshold value set in the register circuit. The threshold value in the register circuit can be changed from external of the display drive circuit, and is selectable, for example, from a plurality of values.

In the present display drive circuit, the display data inputted and outputted is, for example, a data of the RGB format.

The display data stored in the memory is, for example, a data of the YUV format (including Y'U'V' format) which is RGB-YUV converted or YUV-Y'U'V' converted.

The present circuit, in the selection of the YUV format of the data stored in the memory, selects the format from the YUV formats of the plurality of types according to the information on the plurality of adjacent pixels in the data of the YUV format, for example, the chrominance difference information in the horizontal two pixels. Further, the present circuit stores the data converted into the selected YUV format stores in the memory together with the information (format information) for identifying the selected format and the like.

Further, in the present circuit, for example, the YUV format which is the second format has information and data [a first pixel: P1 (Y1, U1, V1), a second pixel: P2 (Y2, U2, V2)] on the Y, U, and V components in the adjacent horizontal two pixels, respectively. The present circuit, for example, calculates the chrominance difference information (|U1−U2|, |V1−V2|) based on the YUV data (Y1, U1, V1) of the P1 and the YUV data (Y2, U2, V2) of the P2, and compares these data with the threshold values (Tu, Tv) relating to the set chrominance difference information, and selects the YUV format of the data stored in the memory according to a size relationship.

As the formats of the plurality of types, for example, in the first (A) YUV format, it is turned into a format (P1: (Y1/2a, U1/2b, V1/2c), P2: ((Y2/2a, U2/2b, V2/2c), however a, b, and c are integer number of one or more) where the plurality of low order bits relating to the luminance (Y) and the chrominance (U, V) in each pixel (P1, P2) of the horizontal two pixels are reduced (thinned out). In the second (B) YUV format, with respect to the luminance information, the information amount of each pixel (P1, P2) is not reduced but kept as it is, and the chrominance difference information is turned into the format (both P1 and P2: (U1+U2)/2 and (V1+V2)/2) averaging the chrominance difference information on each pixel, for example, the same format as the YUV 422 format. For example, it is turned into a format same as the YUV 422 format.

For example, in the selection from the first and second YUV formats, when both pieces of the chrominance difference information of the U and V are smaller than the threshold value, the second YUV format is selected, and when either one piece of the chrominance difference information of the U an V is larger than the threshold value, the first format is selected.

Further, for example, the present circuit is a display drive circuit for outputting a voltage according to the display data inputted externally to a display panel, and comprises a first conversion circuit for converting the display data of the first format (RGB format and the like) from external into a second format (YUV format and the like); a storage circuit for storing the display data of the second format from the first conversion circuit; a second conversion circuit for converting the display data of the second format from the storage circuit into the first format; a voltage generating circuit for generating a plurality of voltages corresponding to a plurality of display data; and a voltage section circuit for selecting the voltage corresponding to the display data of the first format from the second conversion circuit from a plurality of voltages. The first conversion circuit selects a data reduction method of the display data of the second format stored in the storage circuit from a plurality of different data reduction methods according to the display data of the first or the second format, and reduces the data amount by converting the display data of the second format according to the selected data reduction method.

Further, for example, in the present circuit, the first conversion circuit selects a data compression method of the display data of the YUV format to be stored into the storage circuit from a plurality of data compression methods according to a U component and a V component of the display data of the YUV format, and compresses the display data of the YUV format according to the selected data compression method.

Further, for example, the present circuit has a memory control circuit for controlling the memory for storing the display data. The memory control circuit, when storing the display data of the inputted first format (RGB format and the like) in the memory, performs a processing of performing a serial/parallel conversion of the display data of the first format, and converting it once (RGB-YUV conversion) into the display data of the second format (YUV format and the like); a processing of selecting either one of the format conversion methods (YUV-Y'U'V' conversion) of the plurality of types according to a size relationship based on the comparison determination between the chrominance information in a plurality of adjacent pixels of the display data of the second format and the set threshold information; and a processing of converting (YUV-Y'U'V' conversion) the display data of the second format into the third format (Y'U'V' format) of the plurality of types, respectively; and a processing of switching over the output of the display data of the third format after respective conversions based on the selection of the format conversion methods and storing the output of the selected display data in the memory together with the information for identifying the selected format and the like. Further, the memory control circuit, when outputting the display data of the third format stored in the memory to the display panel, performs a processing of recognizing the display data based on the information for identifying the format and the like, and converting (Y'U'V'-RGB conversion) the display data into a fourth format (RGB format and the like) to be outputted to the display panel, and outputting it after performing the parallel/serial conversion.

The format conversion methods of the plurality of types comprise first (A) methods of more than one type for reducing the lower bits of Y, U, and V data in the display data and second (B) methods of more than one type for averaging the U and/or V data for every plurality of pixels adjacent to each other. The types of the formats and the like depend upon a combination of a reduction amount of each bit of Y, U, and V data that is a unit of the plurality of adjacent pixels (horizontal two pixels and the like) in the display data, and the method and the like of averaging in the plurality of pixels.

The effects obtained by typical aspects of the present invention will be briefly described below. According to the present invention, in the display drive circuit of the liquid crystal display device and the like, when the display data is stored in the memory, compression (format conversion) of the data is performed so as to reduce the data amount, thereby realizing a lower cost through the reduction of the memory size, and at the same time, realizing high image quality through the reduction of the image degradation in a specific display image, which has was the problem of the conventional art.

Particularly, the reduction of the data amount stored in the memory by the YUV format can realize a lower cost, and leads to the same image quality as the conventional YUV format in the natural image and the like, and moreover, in the display image such as color letters/lines with large difference of the chrominance information between the horizontal two pixels, feathering and the like are reduced, so that high image quality can be realized.

BRIEF DESCRIPTIONS OF THE DRAWINGS

FIG. 2 is a view showing a U difference threshold value resistor table and a V difference threshold value resistor table in each of the embodiments of the present invention;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted. FIGS. 1 to 9 are used for the description of the present embodiments.

In the following embodiments, as one example of the display device according to a display drive circuit (display device drive unit) of the present invention, a liquid crystal display device for displaying an image by a normally black method will be described as an example. It goes without saying, however, that the display drive circuit can be also applied to a liquid crystal display device for displaying an image by a normally white method through the change of its pixel configuration.

First Embodiment

In a first embodiment, a display data stored in a memory in a display drive circuit is converted into a YUV format, thereby compressing a frame data amount. As a result, a memory size is reduced, and a lower cost is realized, and at the same time, the YUV format display data stored in the memory, based on chrominance (U, V) information on the display data, selects the YUV format in which a data error amount is reduced compared to an input display data from a conventional YUV 422 format and a YUV format where the low order bits of Y, U, V data of each pixel of horizontal two pixels (P1, P2) are reduced (thinned out), and performs a format conversion. As a result, the compression of the memory-stored data having little image degradation is realized. In the display data, arbitrary adjacent horizontal two pixels are represented as P1 and P2.

Figure 1A:
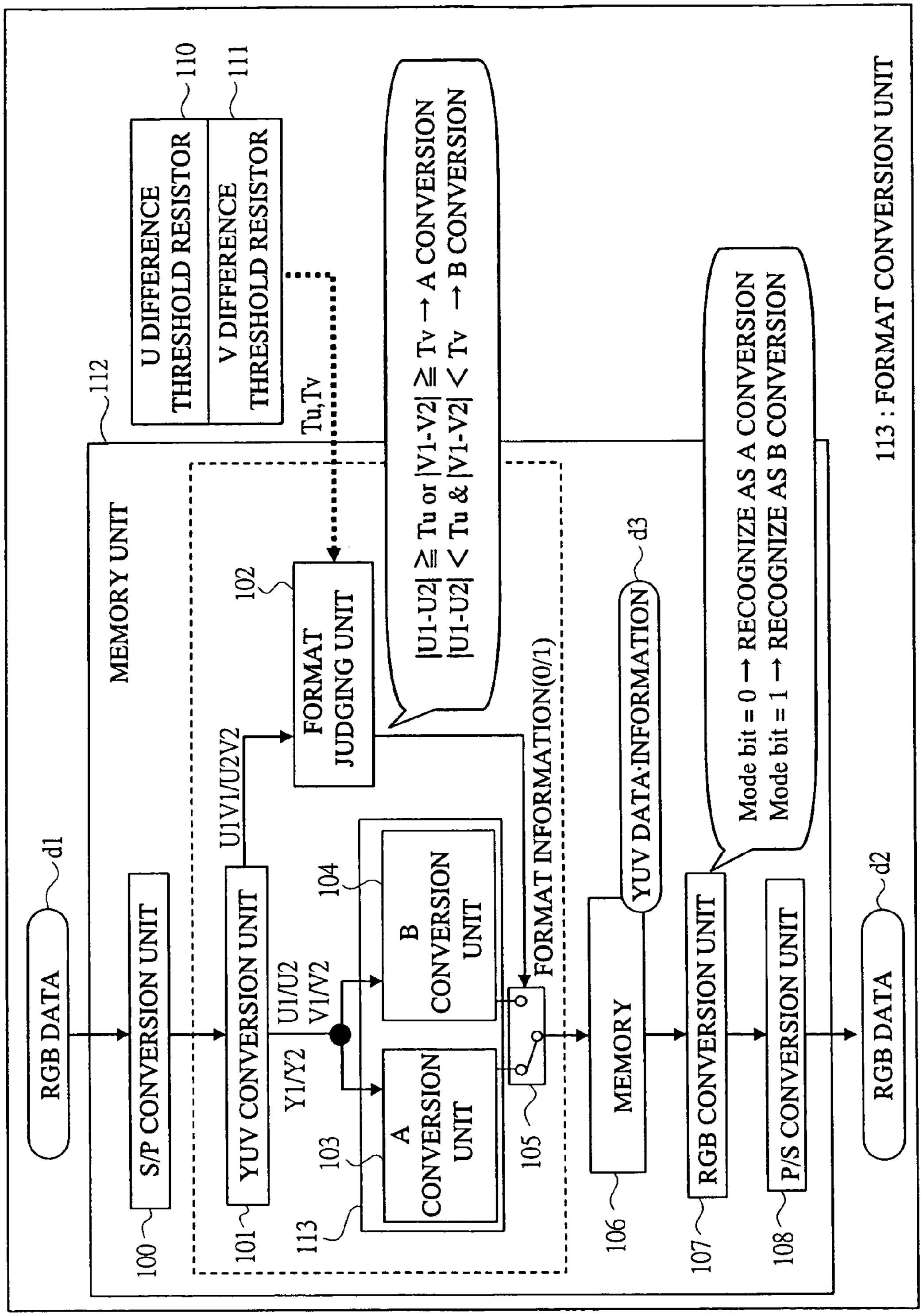
FIG. 1A is a block configuration view regarding a memory control and processing method in a display drive circuit of a first embodiment of the present invention.
Figure 1B:
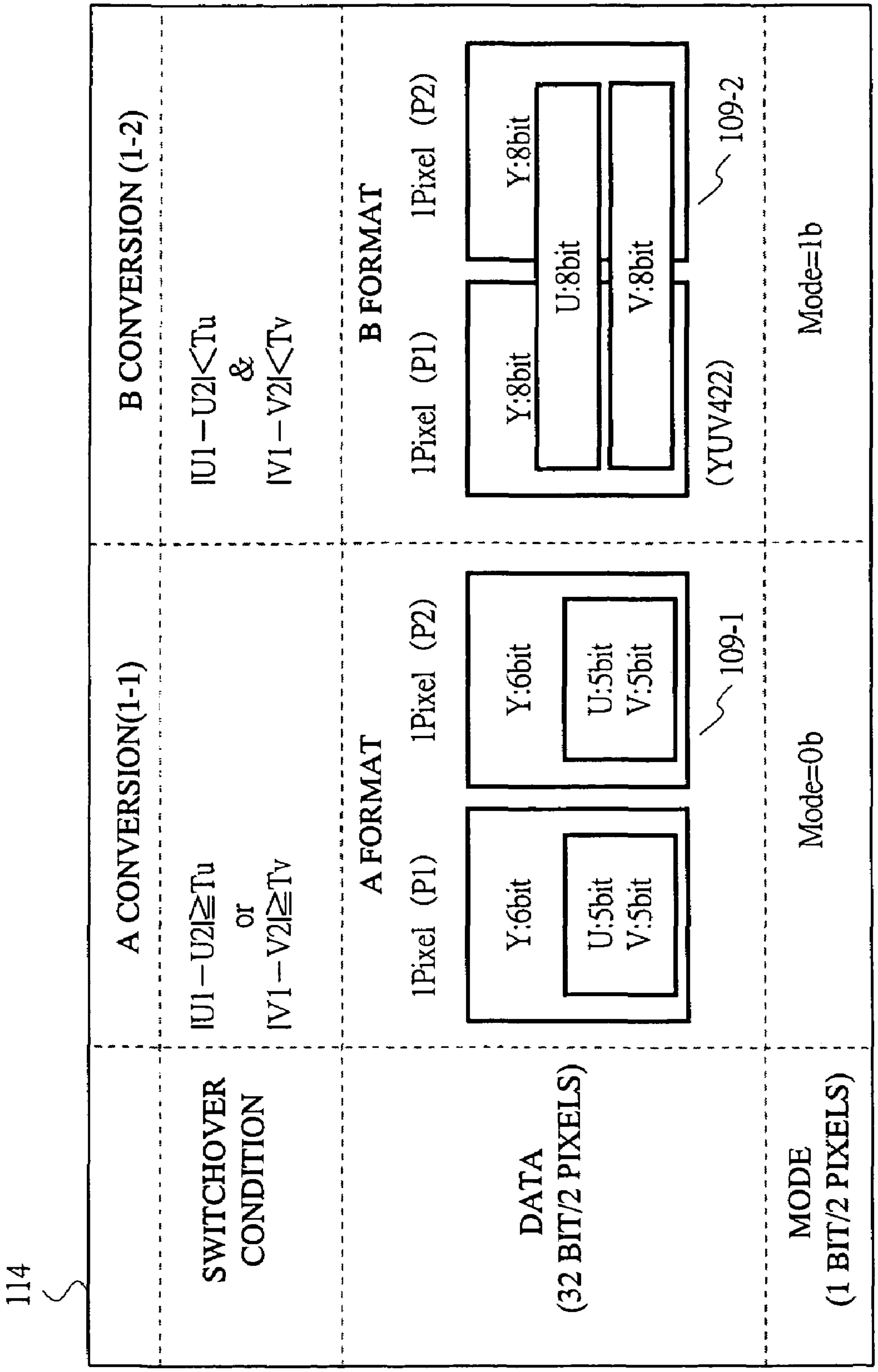
FIG. 1B is an explanatory diagram showing an YUV format conversion in the display drive circuit.

First, with reference to FIGS. 1A and 1B, a memory control method (memory-stored data processing method) in a display drive circuit of the present first embodiment will be described. FIG. 1A shows a block configuration of a memory unit (memory processing unit) 112 including a circuit configuration of a memory and a memory periphery. FIG. 1B shows a format conversion form 114 such as a format conversion content, selecting condition, and the like in the memory-stored data processing.

The content configuration of the memory unit 112 will be described below. In the memory unit 112 in the present display drive circuit, a display data to be inputted is an RGB data (d1) of 24 bits (=8 bits×3), and the display data to be outputted is an RGB data (d2) of 24 bits (=8 bits×3). The data stored in a memory 106 is a YUV data and format information (d3) which is YUV format converted by a format conversion unit 113.

The memory unit 112 includes an S/P conversion unit 100, a YUV conversion unit (RGB-YUV conversion unit) 101, a format judgment unit (memory-stored data format judgment unit) 102, a format conversion unit (memory-stored data format conversion judgment unit) 113, a switch unit (two-selector switch) 105, a memory (display data storing memory) 106, an RGB conversion unit (YUV-RGB conversion unit) 107, and each unit (block) of a P/S conversion unit 108. The format conversion unit 113 includes an A (first) conversion unit (A format conversion unit of YUV data) 103 and a B (second) conversion unit (B format conversion unit of YUV data) 104. Particularly, the portion consisting of reference numerals 101, 102, 113, and 105 framed by a broken line may be rephrased as a memory-stored data compression unit and the like. The format conversion unit 113 and the like are equivalent to a compression circuit for reducing the data amount. The RGB conversion unit 107 corresponds to an expansion circuit for bringing back the data amount corresponding to the compressing circuit.

The S/P conversion unit 100 is a circuit for performing a serial/parallel conversion of the RGB data (d1) inputted to the display. The YUV conversion unit 101 is a circuit for performing an RGB-YUV conversion of the display data parallelized by the S/P conversion unit 100. The YUV conversion unit 101 outputs the display data converted from the RGB format to the YUV format to the format judgment unit 102 and the format conversion unit 113 of the subsequent stage. YUV information (Y1, U1, V1), (Y2, U2, V2) on the horizontal two pixels (P1, P2) in the display data is outputted according to needs.

The format judgment unit 102 calculates a difference ($|U1-U2|$, $V1-V2|$) of chrominance (U, V) information based on a first pixel (P1) YUV data (Y1, U1, V1) and a second pixel (P2) YUV data (Y2, U2, V2) in the YUV information on the horizontal two pixels (P1, P2) that are parallelized and YUV-converted, and performs a comparison with threshold values (U difference threshold value: Tu and V difference threshold value: Tv) relating to the difference of the set chrominance information, and selects and decides the YUV format of the display data stored in the memory 106, in other words, the types of the YUV-Y'U'V' conversion. Based on the data format judgment result at the format judgment unit 102, the switch unit 105 is controlled its switchover.

For the format judgment unit 102, the U difference threshold value Tu and the V difference threshold value Tv are set from an external U difference threshold value register 110 and an external V difference threshold value register 111 of the outside.

In the format conversion unit 113, based on the inputted YUV data, as a YUV conversion, different YUV-Y'U'V' conversions are performed by the A conversion unit 103 and the B conversion unit 104 (A conversion and B conversion), respectively, and Y'U'V' data after the conversion is outputted. The A conversion unit 103 converts the YUV data (Y1, U1, V1) of the P1 and the YUV data (Y2, U2, V2) of the P2 which are the input data into the A format (format the low order bits are thinned out) 109-1. Similarly, the B conversion unit 104 converts the same input data into the B format (conventional YUV 422 format) 109-2.

The switch unit 105, according to the switchover control by the data format judgment result in the format judgment unit 102, switches over the input and output so that either one of the A format 109-1 and the B format 109-2 is selected regarding the YUV data from the format conversion unit 113.

The memory 106 stores the display data of YUV format of the selected A or B and its YUV format information (YUV data and information d3) from the switch unit 105. Here, the YUV format information is information on some forms for identifying the selected format and the content thereof, and includes identification information, Mode bit, and the like.

The RGB conversion unit 107 is a circuit which, based on the YUV format data and the YUV format information (identification information and Mode bit) outputted from the memory 106, recognizes the YUV format of an object display data stored in the memory 106, and performs YUV-RGB conversion. The RGB conversion unit 107, in the case of Mode bit=0, recognizes it as the A conversion (A format 109-1), and in the case of Mode bit=1, recognizes it as the B conversion (B format conversion 109-2). The P/S conversion unit 108 is a circuit which performs a parallel/serial conversion of the RGB data from the parallelized RGB conversion unit 107 and outputs the converted RGB data.

While this processing is a processing mode for performing the YUV-Y'U'V' conversion as the YUV format conversion on the display data once RGB-YUV converted, a mode of putting together the processings of these two stages into one block is also possible.

In the Table of the format conversion form 114 of FIG. 1B, with respect to the A conversion and the B conversion, respectively, first, the switchover condition corresponds to the judgment at the format judgment unit 102 and the switchover condition at the switch unit 105. “Data” indicates the YUV data format after the YUV format conversion at the format conversion unit 113, and particularly, it is the case where the display data is 32 bits per horizontal two pixels. “Mode” indicates the Mode bit value in the YUV format information, and particularly, it is the case where the display data is 1 bit per horizontal two pixels.

In each embodiment, a sign (X-Y) in parentheses accompanies each conversion such as the A conversion and the like shows classification of the conversion and the corresponding format, and it represents a conversion of Yth and format thereof in an embodiment Xth.

In an A format (1-1) 109-1 which is a first format in the first embodiment, luminance information (Y) is information (6 bits) where the low order two bits of each pixel of (P1, P2) are reduced (thinned out), and chrominance information (U, V) is information (five bits) where the low order three bits (Y1[7:2] & Y2[7:2], U1 [7:3] & U2[7:3], V1[7:3] & V2[7:3]) are reduced (thinned out). As a result, in the A format 109-1, the horizontal two pixels data has 32 bits, and together with one bit (Mode bit=0) of the A format information, a total of 33 bits per horizontal two pixels is stored in the memory 106. Hence, as compared with the input display data 48 bits/two pixels, about 30 percent of the data amount can be reduced.

Further, in the B format (1-2) 109-2 which is a second format, the luminance information stores the information amount of each pixel of (P1, P2) in the memory 106 without any reduction (Y1:8 bits, Y2:8 bits), and the chrominance information is information that averages the chrominance information on the horizontal two pixels ((U1+U2)/2:8 bits, (V1+V2)/2:8 bits), and becomes the same format as the general YUV 422 format. The B format 109-2, similarly to the A format 109-1, is in a state of 32 bits in horizontal two pixels, and together with one bit (Mode bit=1) of the B format information, a total of 33 bits per horizontal two pixels is stored in the memory 106. Hence, similarly to the A conversion, as compared with the input display data 48 bits/two pixels, about 30 percent of the data amount can be reduced.

Here, as described about the problem above, the data of the YUV format stored in the memory 106 is format-selected based on the comparison between the chrominance difference information and the threshold value in order to make the error with the original YUV data small. That is, when the difference of the chrominance (U, V) information between the original horizontal two pixels is equal to or less than some threshold values (Tu, Tv), the data is selected as the B format 109-2, and when the difference is equal to or greater than some threshold values (Tu, Tv), the data is selected as the A format 109-1. The switchover conditions are, if expressed in formulas, the A conversion is in the case of $|U1-U2| \geqq Tu$ or $|V1-V2| \geqq Tv$, and the B conversion in the case of $|U1-U2| < Tu$ & $|V1-V2| < Tv$.

The setting values of the threshold values (Tu, Tv) of the chrominance (U, V) difference information can be changed by the setting of the U difference threshold value resistor 110 and the V difference threshold value resistor 111.

Next, in FIG. 2 are shown resistor tables (200 and 201) of the U difference threshold value resistor 110 and the V difference threshold value resistor 111. In this example, the threshold values (Tu, Tv) of the U difference $|U1-U2|$ and the V difference $|V1-V2|$ can be set from four modes of 4, 8, 16, and 32. The resistor value corresponding to each of the threshold values is 00, 01, 10, and 11 in two bits.

The set threshold values in the present resistor tables will be described below. First, the ranges of the U data and V data are from −128 to +128 in terms of eight bits, and the range of the difference data is from 0 to 255.

In the case of the A format 109-1, since the low order three bits of the U and V data are reduced, it is conceivable that the U and V data errors due to compression recovery are seven at the maximum. With respect to the Y data error, since the lower two bits are reduced, it is conceivable that its error is three at the maximum. On the other hand, the U and V data errors of the B format 109-2 (YUV 422 format) are due to the averaging of the horizontal two pixels, it is conceivable that the U and V data errors are 128 at the maximum. The Y data error is zero.

In other words, in the selection of the A format 109-1, while the U and V data errors can be controlled to be below eight, the error of the Y data in which the error is easily observed due to human visual characteristics is three at the maximum. On the contrary, in the selection of the B format 109-2, the larger the set threshold value becomes, the larger the errors of the U and V data become, (for example, if the threshold value is eight bits, the maximum data error of the U and V are four, and if the threshold value is 16, the maximum data error of the U and V are eight) but there exists no Y data error.

From these facts, the set threshold value is a value in which the U and V data errors when selecting the B format 109-2 do not exceed the U and V data errors of the A format 109-1, and moreover, it is considered appropriate that the threshold value is made large to the extent of making the format selecting condition rigid. Hence, in this case, it is considered appropriate that the threshold value is about 16.

However, through the compression and expansion method of the YUV data format in the data compression time and expansion time, the maximum values of the U and V data errors are varied, and therefore, the most appropriate threshold value is not always limited to 16. Besides, as a user, when he wants to increase the number of processings at the conventional YUV 422 format processing, he may set the threshold value large as 32.

Thus, it is preferable that the threshold value can be plurally set in the vicinity of the above described value 16 in order to make a degree of freedom in the selection of the YUV format large.

In the present example, while both the U difference threshold value resistor 110 and the V difference threshold value resistor 111 are changeable by four modes, needless to mention, the number of these modes can be increased or decreased. Further, without performing the resistor setting, the threshold values can be used as fixed values. In this case, there is no need to perform the resistor setting.

In the present embodiment, since it is presumed that the RGB input-output is processed by one pixel unit, the present embodiment constitutes the S/P conversion unit and the P/S conversion unit, but when the input-output data is processed by two pixels unit in the memory unit 112, even if these conversion units are eliminated, the advantages of the present invention can be similarly obtained.

Figure 3A:
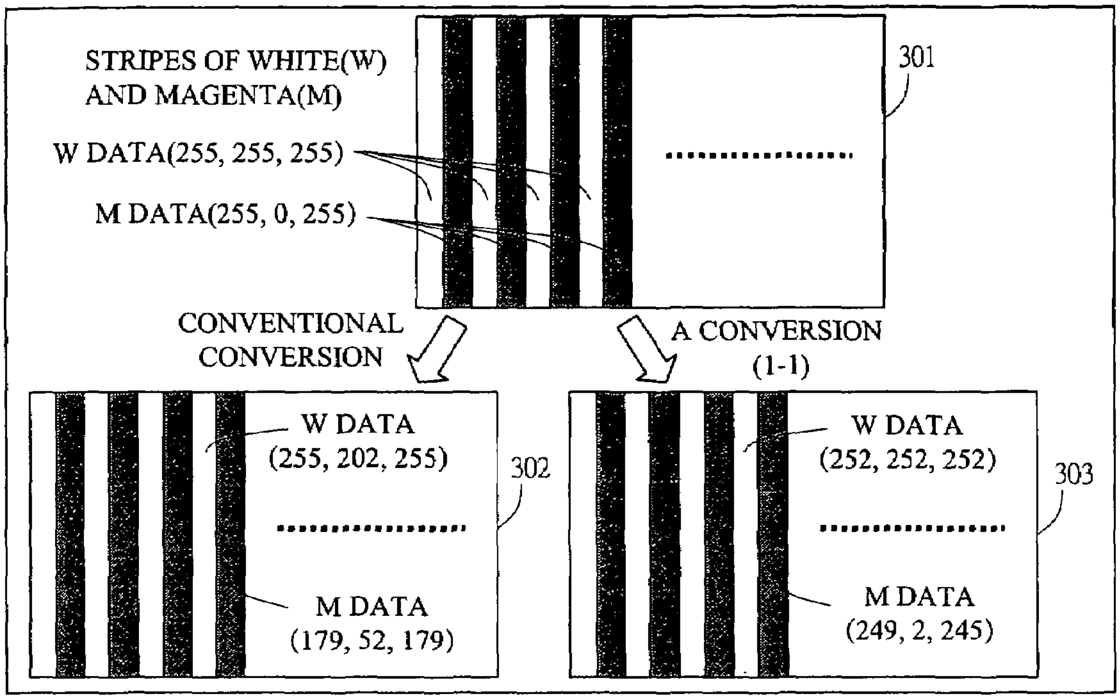
FIG. 3A is an explanatory drawing showing an advantageous effect in an example of a display image of a YUV format memory compression in the first embodiment of the present invention, and shows an image degradation reduction effect of the display image of white and magenta stripes.
Figure 3B:
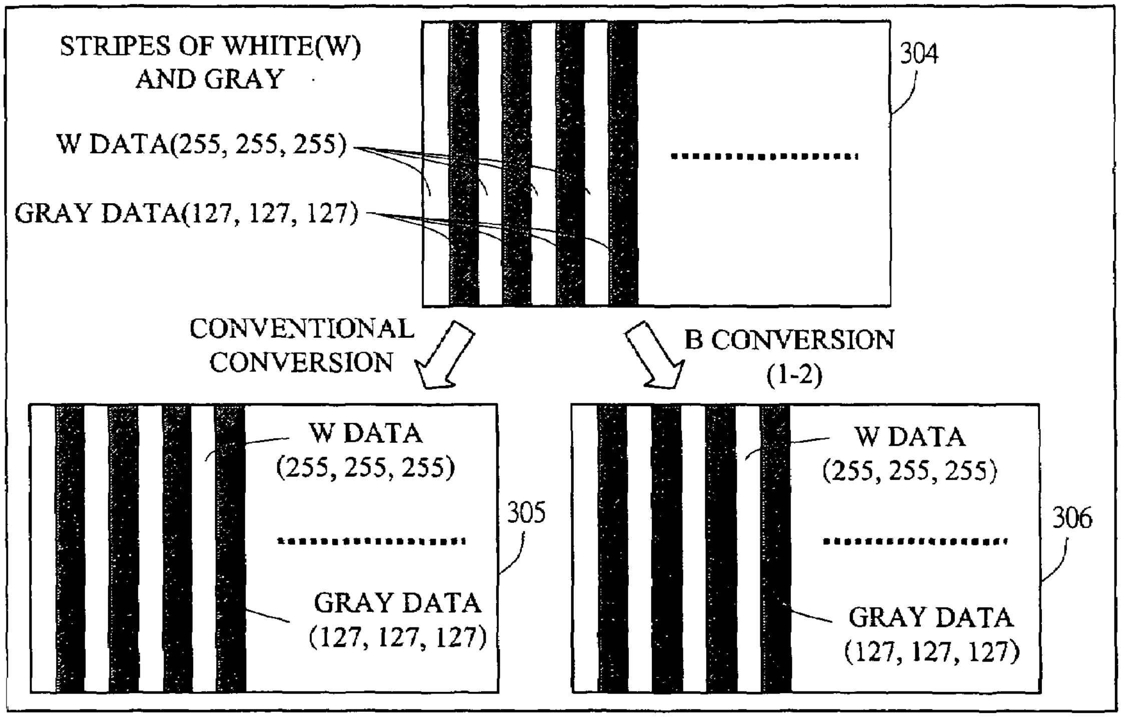
FIG. 3B is an explanatory drawing showing an advantageous effect in an example of a display image of a YUV format memory compression in the first embodiment of the present invention, and shows the image degradation reduction effect of the display image of the white and gray stripes.

Next, in FIGS. 3A and 3B, by using two types of display images as examples, the advantageous effect of the processing at the display drive circuit of the present embodiment will be specifically shown. In a first example shown in FIG. 3A, when the display image is made of QVGA resolution and RGB 24 bits, the case is shown as an example, where the display image is made of vertical stripes by white data (R=255, G=255, B=255) and magenta data (R=255, G=0, B=255). Next, in a second example shown in FIG. 3B, when the display image is similarly made of QVGA resolution and RGB 24 bits, the case is shown as an example, where the display image is made of vertical stripes of white data (R=255, G=255. B=255) and gray data (R=127, G=127, B=127). The parentheses of the data show a gradation level value of (R, G, B) or (Y, U, V). Note that, the above described vertical stripes consist of colors which changes in each of pixels horizontally adjacent to each other.

First, the first example shown in FIG. 3A will be described. The original display data that is not data-compressed (format-converted) is a display image (striped original image of white (W) and magenta (M)) 301.

When the data compression (format conversion) is performed for the display image 301 at the memory unit 112, first, as described in FIG. 1, the inputted RGB data (d1) of 24 bits is, first, parallel-converted by the S/P conversion unit 100, and after that, it is converted into the YUV data by the YUV conversion unit 102. At this time, the YUV information (Y1, U1, V1) of the white data is (255, 0, 0), and the YUV information (Y2, U2, V2) of the magenta data is (105, 84, 106).

Here, in the conversion of the conventional method, since the chrominance information is averaged, with respect to the luminance information, Y1=255 and Y2=105 are stored in the memory 106, while the chrominance information is stored in the memory 106 as U=(0+84)/2=42 and V=(0+106)/2=53. As a result, when the YUV data read from the memory 106 is RGB-converted, the YUV data (Y1, U1, V1) of the white data is turned into (255, 42, 53), and the RGB data converted by YUV-RGB conversion calculation is turned into (R=329, G=202, B=329) calculation-wise. Here, since the R data and the B data are applied with an overflow processing, they are turned into (R=255, G=202, B=255). Similarly, since the YUV data (Y1, U1, V1) of magenta is turned into (105, 42, 53), the RGB data converted by the YUV-RGB conversion calculation is turned into (179, 52, 179).

From the aforementioned, a display image 302 after data compression by the conventional method has a G data shifted by 53 gradations for the white data, and a R data shifted by 76 gradations, a G data by 52 gradations, and a B data by 76 gradations for the magenta data. As a result, it is known that the display data of the stripes of white and magenta is collapsed in color balance and has a sharp degradation of image.

On the other hand, the conversion according to the present embodiment is performed as follows. The YUV format is selected for the display image 301 according to the difference of the chrominance information, and therefore, the chrominance information becomes |U1−U2|=84, |V1−V2|=106, and hence, the YUV format to be selected becomes the A format 109-1.

In the A format 109-1, with respect to luminance information, since the low order two bits are reduced, it is turned into Y1=255/4≈63 and Y2=105/4≈26 (six bits each for Y1 and Y2), and is stored in the memory 106. With respect to the chrominance information, since the low order three bits are reduced, it is turned into U1=0/8=0, V1=0/8=0, U2=84/8≈10, and V2=106/8≈13 (five bits each for U1, V1, U2, and V2), and is stored in the memory 106. At this time, Mode bit=1 is stored in the memory 106 together with the A format data.

The reduction of the low order two bits, that is, the right shift by two bits makes a value of the original data divided by four with omitting decimals thereof, and similarly, the right shift by three bits makes a value of the original data divided by eight with omitting decimals thereof. This means, by changing a logic circuit, a configuration where the number after the decimal point is rounded or a configuration where the number after the decimal point is rounded up is possible.

Next, the YUV data and the Mode bit are read from the memory 106, and because Mode bit=1, it is recognized that the YUV format is the A format 109-1. The YUV data which is recognized as the A format 109-1 is expanded as follows. First, the YUV data of the white data becomes (Y1×4=252, U1×8=0, V1×8=0), and the YUV data of the magenta data becomes (Y2×4=104, U1×8=80, V2×8=104).

Finally, the RGB data converted by the RGB conversion unit 107 has the white data as (R=252, G=252, B=252), and the magenta data as (R=249, G=2, B=245).

From the aforementioned, the display image 303 after the compression performed according to the present embodiment has the R data, the G data and the B data shifted by three gradations each for the original white data, and has the R data shifted by six gradations, the G data shifted by two gradations, and the B data shifted by 10 gradations each for the magenta data. From this result, it is known that, in the conversion of the present embodiment, the image degradation due to the data difference is little as compared with the conversion of the conventional method.

Next, the second example shown in FIG. 3B will be similarly described. First, the original display data not data-compressed is an original display image (striped original image of white (W) and gray) 304.

When the display image 304 is data-compressed in the memory unit 112, since it is similarly processed as the first example shown in FIG. 3A in the conversion of the conventional method, a display image 305 after the data compression has a white data turned into (R=255, G=255, B=255), and a gray data turned into (R=127, G=127, B=127). From this, in the second example, it is possible to display a screen image without image degradation in the conversion of the conventional method.

On the other hand, in the conversion of the present embodiment, since the YUV format is selected by the difference of the chrominance information, it becomes |U1−U2|=0 and |V1−V2|=0, and therefore, the selected YUV format becomes the B format 109-2.

The B format 109-2 is stored in the memory 106 by the YUV 422 format, that is, the same format as the conventional method. Hence, similarly to the conventional method, a display image 306 after the data compression in the conversion of the present embodiment has a white data turned into (R=255, G=255, B=255), and a gray data turned into (R=127, G=127, B=127). From this, it is possible to display a screen image without image degradation in the second example in the conversion of the present embodiment, similarly to the conventional conversion.

As an example of the display image having the same result as the second example, there exist photographic images and the like including test pattern images of horizontal color gradation, and color gradation such as sun set color and the like. In the case of these display images, since the chrominance difference information is small, the image degradation is little in the conversion of the conventional method, and in the present embodiment also, the same image quality as the conventional one can be obtained.

Figure 4:
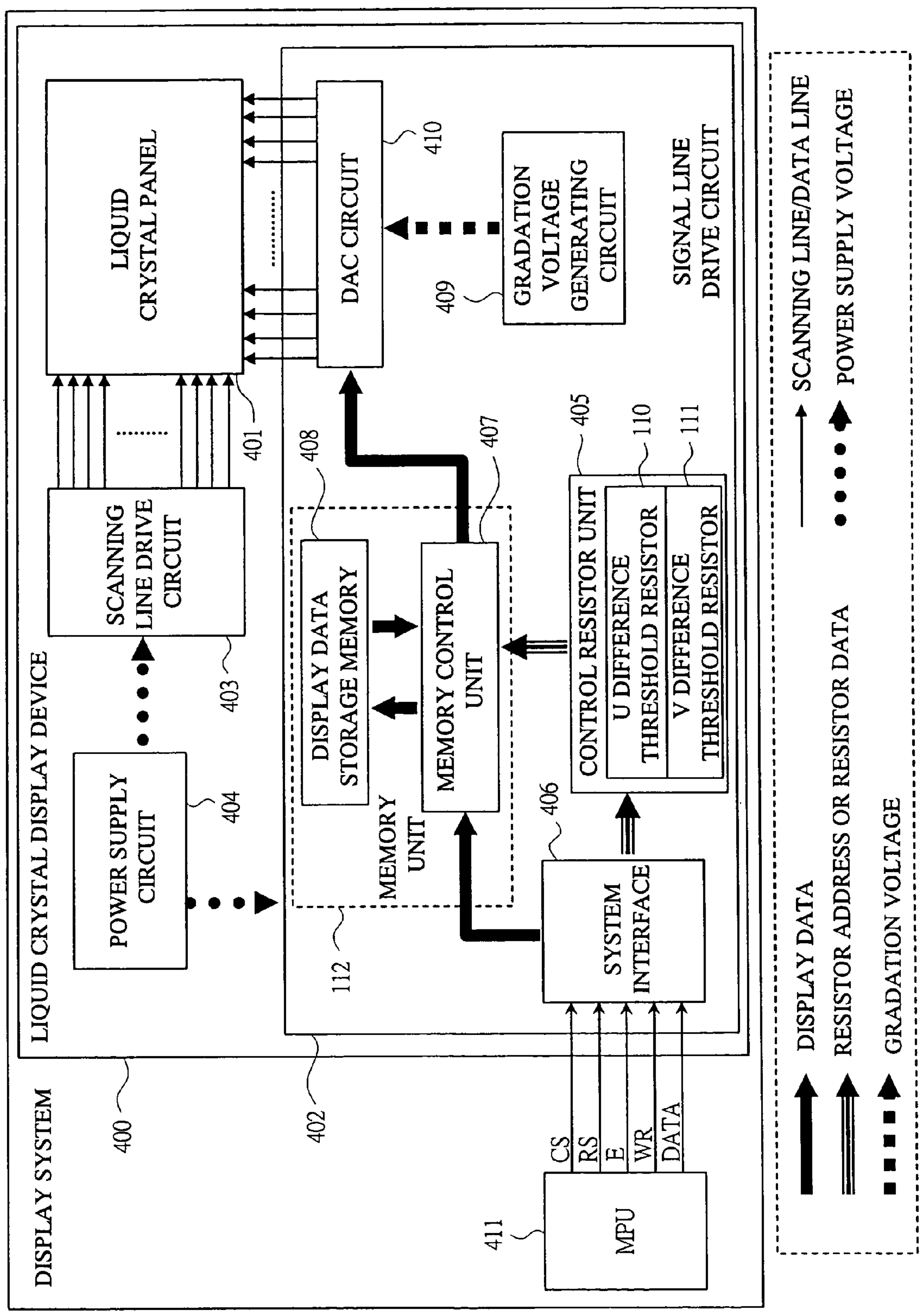
FIG. 4 is a block diagram of a liquid crystal display device and display system in an embodiment of the present invention.

Next, referring to FIG. 4, one example of the configuration of a liquid crystal display device mounted with the memory unit 112 in the present embodiment will be described. FIG. 4 shows the configuration of a display system including the liquid crystal display device. The present display system comprises a liquid crystal display device 400 of the present embodiment and an MPU (microprocessor unit) 411 which is a data control unit for controlling the entire liquid crystal display device 400. In the liquid crystal display device 400, each drive circuit is connected with the MPU 411. The MPU 411 performs various types of processings and controls for displaying an image on a liquid crystal panel 401.

The liquid crystal display device 400 is configured by a liquid crystal panel 401, a signal line drive circuit 402, a scanning line drive circuit 403, and a power supply circuit 404. The signal line drive circuit 402 is a display drive circuit including the memory unit 112, and outputs a gradation voltage corresponding to the display data to the data line (signal line) of the liquid crystal panel 401. The scanning line drive circuit 403 applies a scanning signal to the scanning line of the liquid crystal panel 401. The power supply circuit 404 supplies an operating power to the signal line drive circuit 402 and the scanning line drive circuit 403.

The signal line drive circuit 402 is configured by comprising a system interface (serial interface) 406, a control resistor unit 405, the memory unit 112, a gradation voltage generating circuit 409, and a DAC (digital analogue converter) circuit (referred to also as decode circuit) 410. Each drive circuit such as the signal line drive circuit and the like can be also rephrased as a driver IC and the like.

In FIG. 4, a thick solid line arrow denotes a bus line of the display data. The display data of the RGB format is inputted and outputted in the memory unit 112. The control resistor unit 405 is inputted and outputted with resister addresses or resister data. From the power supply circuit 404, power supply voltages are inputted to the signal line drive circuit 402 and the scanning line drive circuit 403. From the gradation voltage generating circuit 409, the gradation voltage is inputted to the DAC circuit 410. A thin solid arrows denotes a scanning line from the scanning line drive circuit 403 or a data line from the DAC circuit 410.

The system interface 406 performs an exchange of the display data and the control data with the MPU 411. The control resistor unit 405 receives a resistor address data and an index resistor data outputted from the system interface 406. The control resistor unit 405 includes the U difference threshold value resistor 110 and the V difference threshold value resistor 111.

The memory unit 112 comprises a memory control unit 407 and a display data storage memory (RAM) 408 connected thereto. The present display data storage memory 408 corresponds to the memory 106 of FIG. 1, and is used as a frame memory, that is, a memory for the display frame data storage mainly to the liquid crystal panel 401.

The memory control unit 407 is a circuit for controlling the display data storage memory 408, and receives a display data (RGB format) outputted from the system interface 406. The memory control unit 407 performs each processing including storing the display data into the memory 106 as shown in FIG. 1 by reading and writing data for the display storage memory 408, and outputs the display data (RGB format) to the DAC circuit 410. The memory control unit 407 is inputted with a resistor value from the control resistor unit 405. The display data storage memory 408 stores the display data outputted by writing from the memory control unit 407, and outputs the stored display data by reading to the memory control unit 407. In FIG. 1, though a mode of executing a series of processing steps (100 to 108) in order is shown, as shown in FIG. 4, the display data may be stored any time in the display data storage memory 408 according to the processing steps.

The gradation voltage generating circuit 409 generates a voltage level of 256 gradations corresponding to RGB with eight bits each, and outputs the gradation voltage to the DAC circuit 410. The DAC circuit 410 is a circuit which selects the gradation voltage from the gradation voltage generating circuit 409 according to the display data and outputs it to the signal line of the crystal liquid panel 401.

The system interface 406, upon receipt of the display data and instructions outputted by the MPU 411, performs an operation of outputting them to the control resistor unit 405. The details of the operation, for example, conforms to the bus interface of 68-system 16-bit, and is configured by a CS (Chip Select) signal indicating a chip selection, a RS (Register Select) signal selecting whether to designate the resister address or the resistor data of the control register unit 405, an E (Enable) signal instructing an activation of the processing operation, a WR (Write Read) signal for selecting writing or reading the data, and a DATA signal which is the set value of the address or the data of the control resistor 405.

Here, what is meant by the instructions is information for deciding internal operations of the signal line drive circuit 402, the scanning line drive circuit 403, and the power supply circuit 404, and includes various parameters such as frame frequency, the number of drive lines, drive voltage, gamma adjustment in the gradation voltage generating circuit 409, and the like. It also includes the information regarding the U difference threshold value resistor 110 and the V difference threshold value resistor 111, which is one of the features of the present embodiment. The control resistor unit 405 stores the data of the instructions, and output them to the block of each drive circuit.

Note that, each processing in the memory unit 112 of FIG. 1 may be mounted as a dedicated circuit or may be mounted in the form to be processed by a program.

From the aforementioned, the set value of each resistor of the control resistor 405 can be easily changed separately externally, so that the threshold values (Tu, Tv) of the differences of the chrominance (U, V) information of the YUV storage format can be changed.

In the configuration of the present embodiment, since the signal line drive circuit 402 contains the display data storage memory 408 which becomes a frame memory, when the display data toward the liquid crystal panel 401 is a still image, a data processing is needed to be performed between the memory unit 112 and the DAC circuit 410, and there is no need to perform the data processing from the MPU 411.

Second Embodiment

Figure 5:
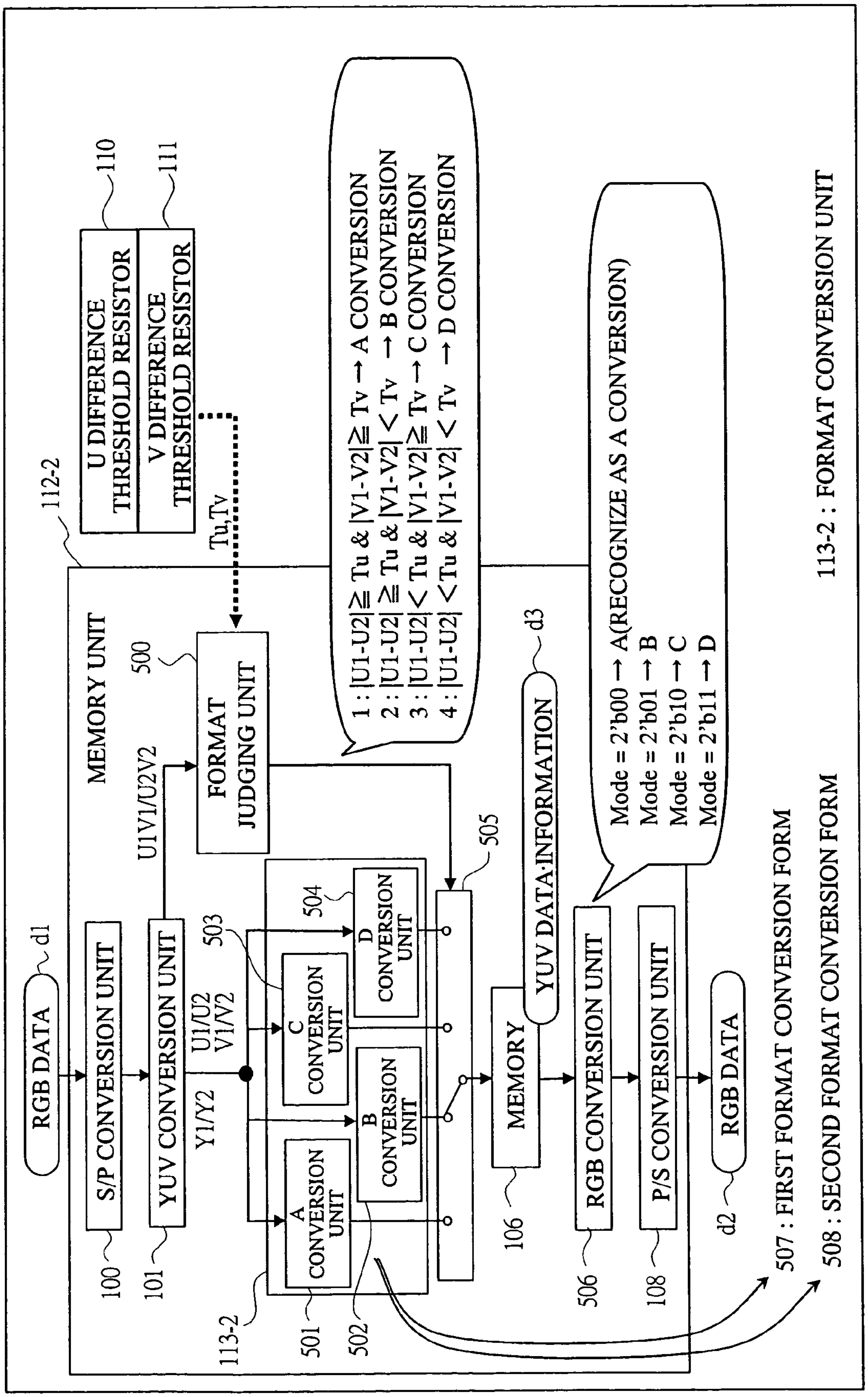
FIG. 5 is a block diagram regarding a memory control and processing method in a display drive circuit of a second embodiment of the present invention.
Figure 6A:
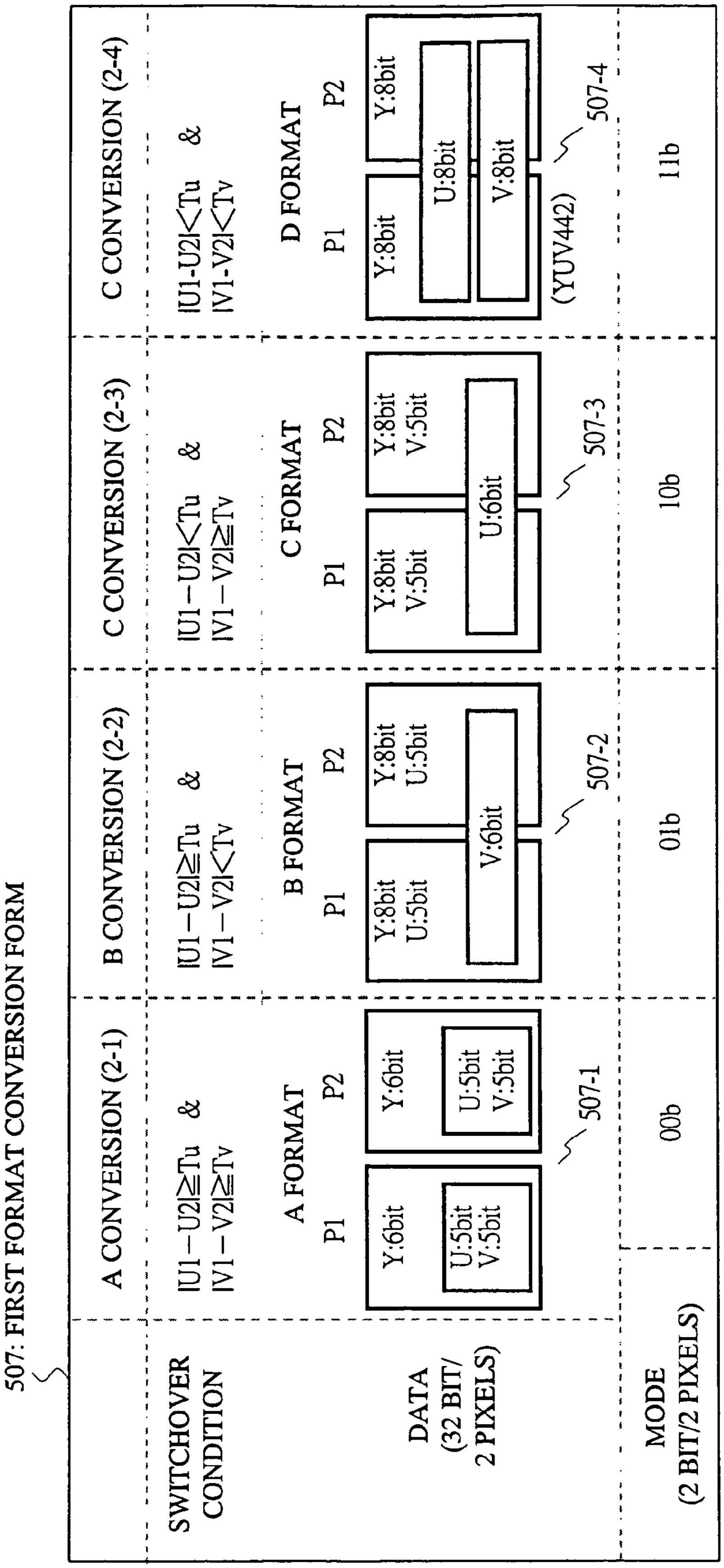
FIG. 6A is an explanatory diagram showing a first format conversion form which are two types of YUV conversions in the display drive circuit of the second embodiment of the present invention.
Figure 6B:
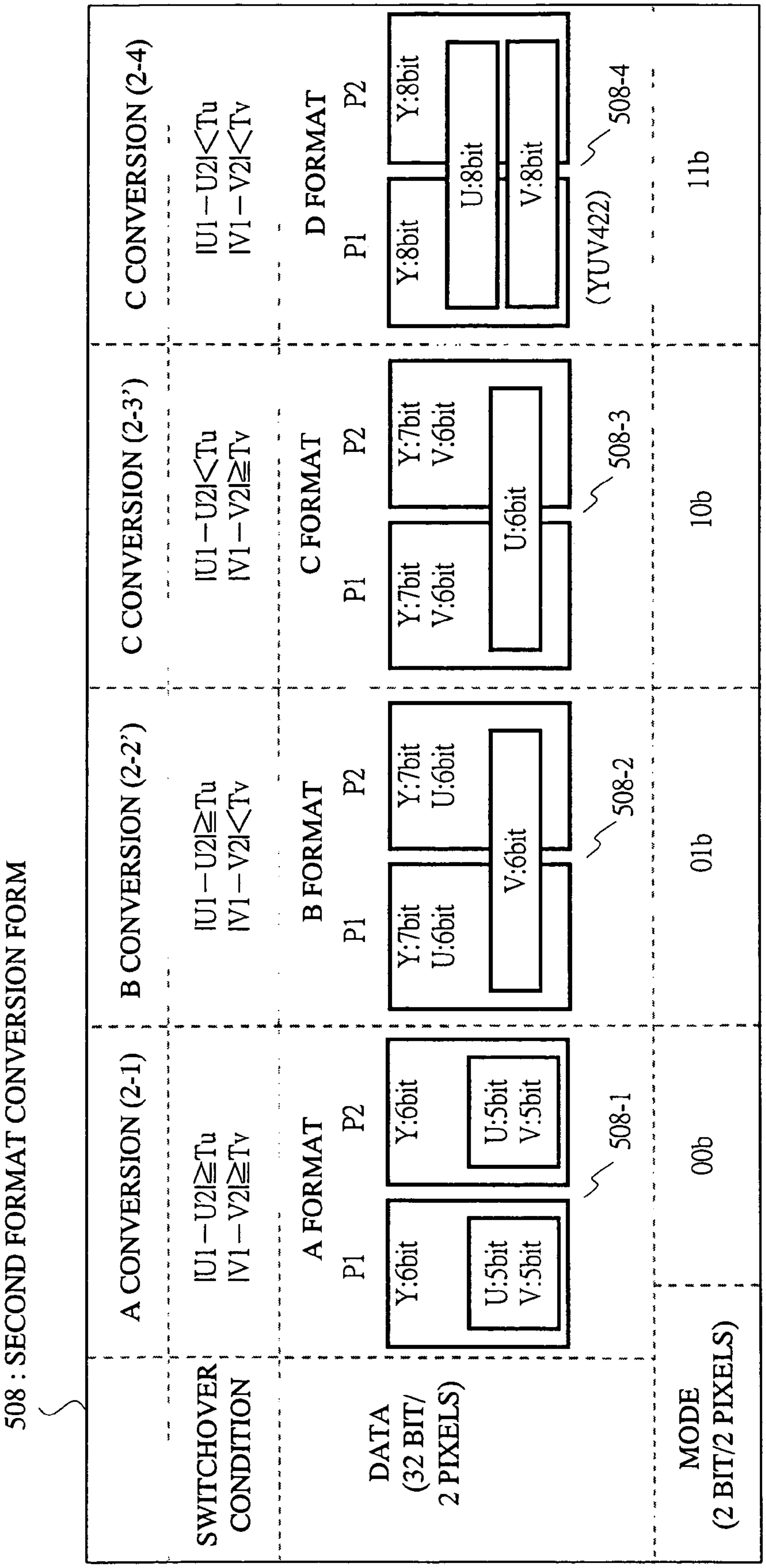
FIG. 6B is an explanatory diagram showing a second format conversion form which are two types of YUV conversions in the display drive circuit of the second embodiment of the present invention.

Next, a second embodiment of the present invention will be described with reference to FIGS. 5 to 7B and the above described FIGS. 2 and 4. FIG. 5 shows a block diagram of a memory unit 112-2 in a display drive circuit of the second embodiment similarly to the first embodiment. FIGS. 6A and 6B show format conversion contents, selecting conditions, and the like in memory storage data processings of two types in the second embodiment similarly to the first embodiment.

Figure 7A:
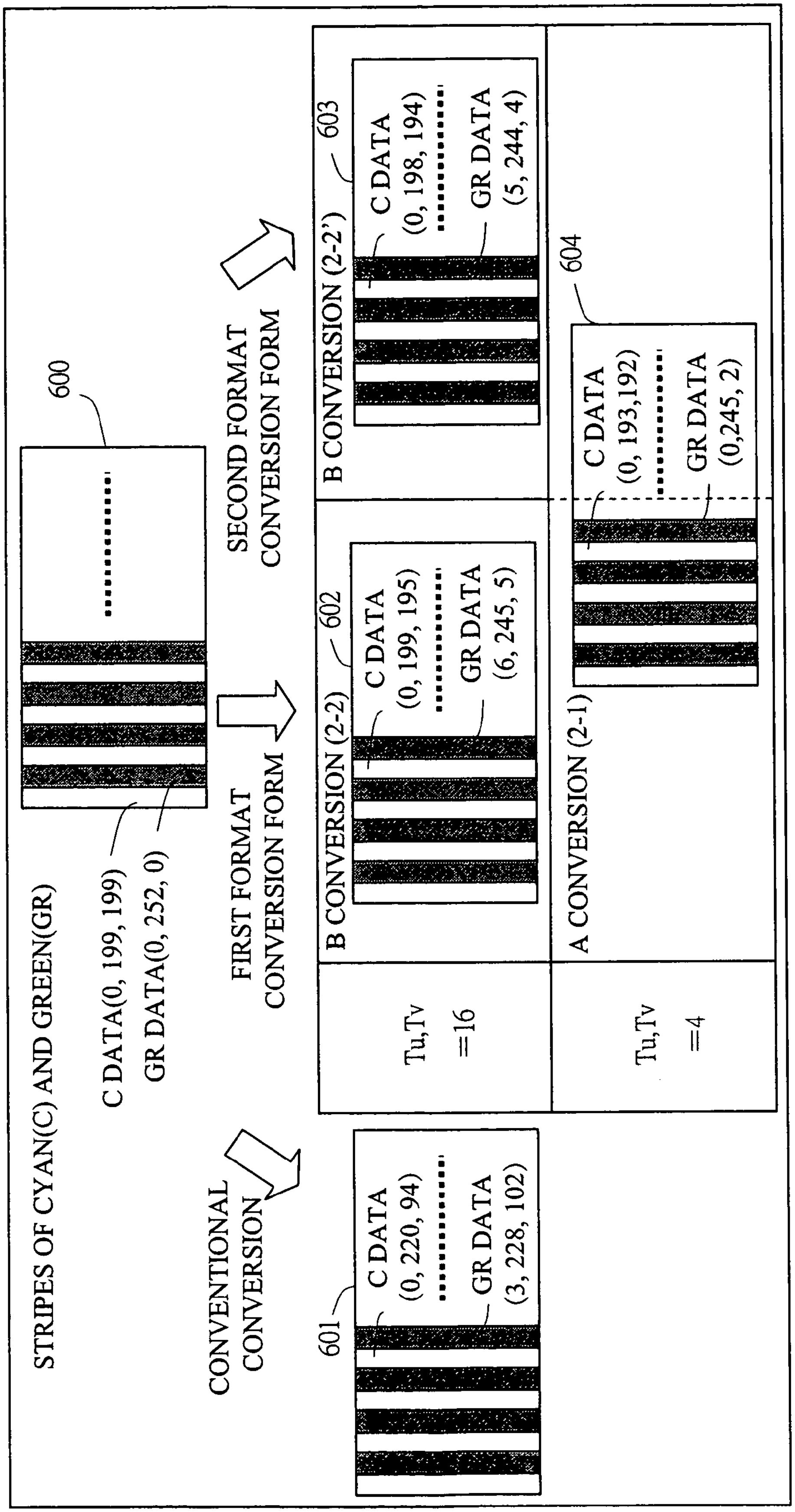
FIG. 7A is an explanatory diagram showing an advantageous effect in an example of the display image of YUV format memory compression in the second embodiment of the present invention, and shows the image degradation reduction effect of the display image of cyan and green stripes.
Figure 7B:
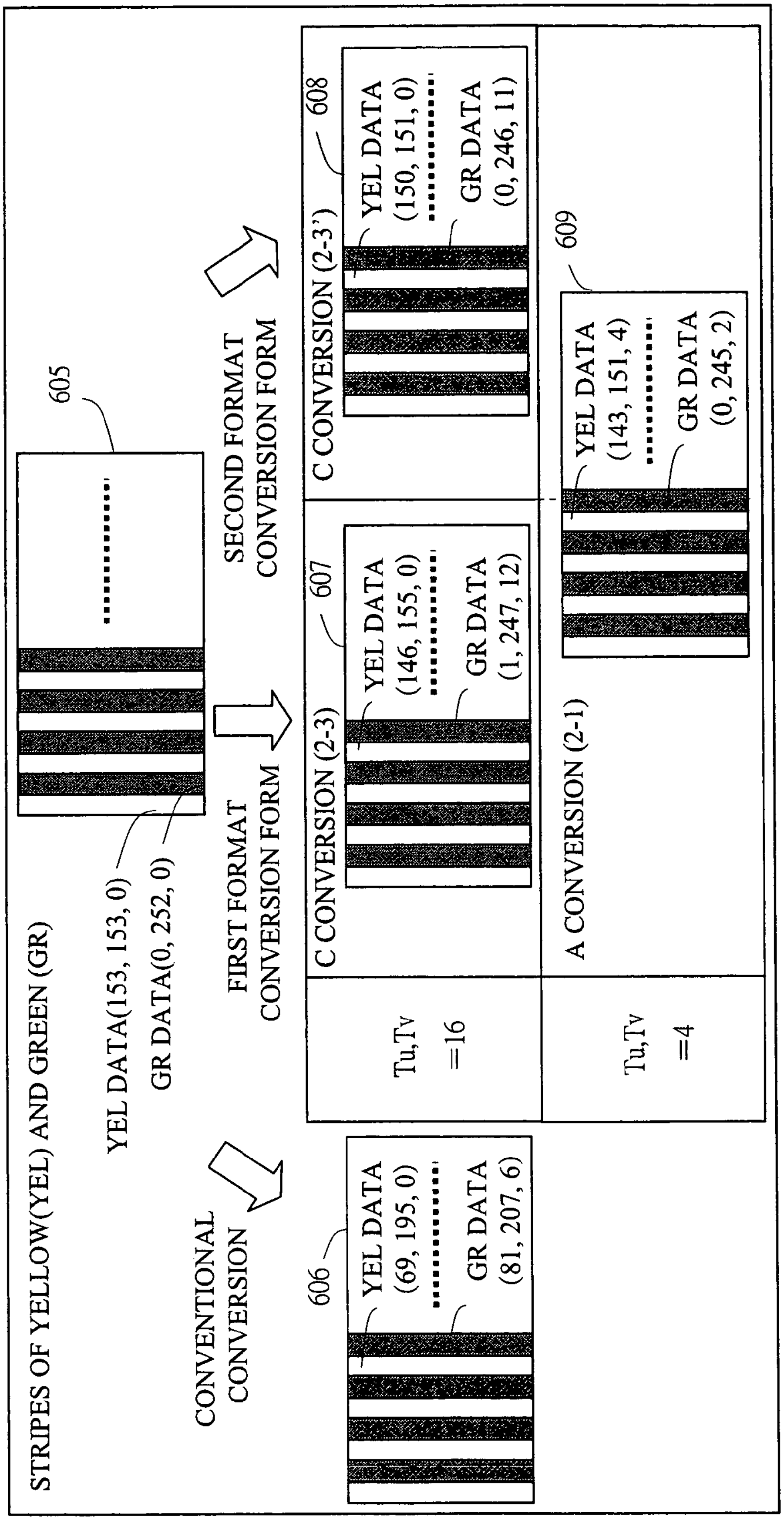
FIG. 7B is an explanatory diagram showing an advantageous effect in an example of the display image of YUV format memory compression in the second embodiment of the present invention, and shows the image degradation reduction effect of the display image of cyan and green stripes shows the image degradation reduction effect of the display image of yellow and green stripes.

FIGS. 7A and 7B show advantageous effect in the examples of two display images similarly to the first embodiment.

The second embodiment is a memory compression method (method for reducing a data amount of a display data stored in a memory 106 and a circuit configuration thereof) for selecting a data format to be stored in the memory 106 based on chrominance information on horizontal two pixels (P1, P2) similarly to the first embodiment. In this method, the second embodiment comprises the YUV 422 format as a data format to be selected according to the judgment of the display data, and when the data format to be selected is not turned into the YUV 422 format, a reduction amount of luminance information is made little, thereby reducing image degradation. This corresponds to reducing the reduction amount of the luminance information by selecting not an A conversion, but a B conversion or a C conversion.

Specific realizing means in the display drive circuit of the second embodiment is as follows. In the second embodiment, as a YUV format data to be stored in the memory 106, a YUV format (A to D formats) is selected based on chrominance difference information on horizontal two pixels of the display data. The selecting conditions at that time are classified into a first selecting condition in which both U and V data differences are greater than the threshold values (Tu, Tv), a second selecting condition in which the U data difference only is greater than the threshold value (Tu), a third selecting condition in which the V data difference only is greater than the threshold value (Tv), and a fourth selecting condition in which both the U and V data differences are less than the threshold values (Tu, Tv).

At the first selecting condition time, the low order bits of the chrominance information (U, V) and luminance information (Y) are reduced. At the second selecting condition time, the fact that the difference in the V data of the horizontal two pixels is small is utilized, and the V data is averaged in the horizontal two pixels, and the amount of the V data stored into the memory 106 is reduced, thereby reducing the reduction amount of luminance information. At the third selecting condition time, the fact that the difference in the U data of the horizontal two pixels is small is utilized, and the U data is averaged in the horizontal two pixels, and the amount of the U data stored into the memory 106 is reduced, thereby reducing the reduction amount of luminance information. At the fourth selecting condition time, the data format is stored in the memory 106 by the YUV 422 format.

With the configuration described above, the second and third selecting conditions were processed similarly as the first selecting condition in the case of the first embodiment, however, in the second embodiment, each of them is a selecting condition that reduces a reduction amount of the luminance information without increasing the error amount of the U and V information, and thereby, the processing of the result can be realized.

Next, with reference to FIG. 5, a memory control and processing method in the display drive circuit in the second embodiment will be described.

The memory unit 112-2, as compared with the configuration of the first embodiment, is different from the first embodiment in that the selection of the YUV format storing the YUV format data for the horizontal two pixels that parallelizes and YUV-converts the input RGB data (d1) is performed according to four selections from the A conversion to D conversion and that, relating to this selection, the YUV format information in the compression and expansion of the YUV format data stored in the memory 106 becomes two bits.

A format conversion unit 113-2 comprises an A conversion unit 501 to a D conversion unit 504 those perform each conversion corresponding to A to D formats. The condition at the judging time in a format judging unit 500 is shown in FIGS. 6A and 6B. Note that, the A format in the second embodiment corresponds to the A format in the first embodiment, and the D format in the second embodiment corresponds to the B format in the first embodiment. The B format and the C format in the second embodiment are added in the second embodiment.

An internal configuration of the memory unit 112-2 at the second embodiment will be described below. In the memory unit 112-2, an S-P conversion unit 100, a YUV conversion unit 101, the memory 106, and a P/S conversion unit 108 have the same configurations as those of the first embodiment. A U different threshold value resistor 110 and a V difference threshold value resistor 111 those input threshold values (Tu, Tv) to the memory unit 112-2 have also the same configurations as those of the first embodiment.

With respect to other internal blocks, a memory storage data format judging unit 500 parallelizes the RGB input data by the S/P conversion unit 100, and based on chrominance (U, V) information on the horizontal two pixels converted into YUV data by the YUV conversion unit 101, selects any of the A to D conversions with the first to fourth selecting conditions, and outputs the YUV format information of two bits.

The A conversion unit 501 converts the YUV data for the horizontal two pixels which is given by parallelizing the RGB input data and made it to YUV data into a first YUV format (A format) to be stored in the memory 106. Similarly, the B conversion unit 502 converts the input YUV data into a second YUV format (B format), and the C conversion unit 503 converts the input YUV data into a third YUV format (C format), and the D conversion unit 504 converts the input YUV data into a fourth YUV format (D format).

A switch unit 505, based on the YUV format information outputted from the format judging unit 500, selects and outputs any format from the first to fourth YUV formats outputted from the A conversion unit 501 through the D conversion unit 504.

An RGB conversion unit 506, based on the YUV format data and the YUV format information of two bits outputted from the memory 106, performs YUV-RGB conversion.

Next, the internal operation will be described. Similarly to the first embodiment, the input RGB data is parallelized into the data for the horizontal two pixels in the S/P conversion unit 100, and is RGB-YUV converted in the YUV conversion unit 101.

Among the YUV data (Y1, U1, V1) of the first pixel (P1) and the YUV data (Y2, U2,V2) of the second pixel (P2) of the horizontal two pixels outputted from this YUV conversion unit 101, chrominance information (U1, V1) on P1 and chrominance information (U2, V2) on P2 are inputted to the format judging unit 500. In the format judging unit 500, based on the chrominance difference information on the horizontal two pixels, Mode bit is selected and outputted.

Here, with respect to the Mode bit outputted from the format judging unit 500, in the case of the first selecting condition in which both the U and V data differences are not less than the threshold values (Tu, Tv) the Mode bit is taken as 2'b00, and in the case of the second selecting condition in which the U data difference only is not less than the threshold value (Tu) the Mode bit is taken as 2'b01, and in the case of the third selecting condition in which the V data difference only is not less than the threshold value (Tv) the Mode bit is taken as 2'b10, and in the case of the fourth selecting condition in which both the U and V data differences are smaller than the threshold values (Tu, Tv) the Mode bit is taken as 2'b11. It does not matter even if the Mode bit value is changed according to needs.

The YUV data (Y1, U1, V1) of the P1 and the YUV data (Y2, U2, V2) of the P2 of the horizontal two-pixels outputted from the YUV conversion unit 101 are also inputted to the A conversion unit 501 through the D conversion unit 504.

The YUV format converted in the A conversion unit 501 through the D conversion of the format converting unit 113-2 will be described. The form (system) of the YUV format conversion with each selecting condition in the second embodiment is divided into a first format conversion form 507 shown in FIG. 6A and a second format conversion form 508 shown in FIG. 6B. In this example, the processing will be performed by using either one of these two types of the format conversion forms. That is, the present display drive circuit is supposed to be in the mode of being mounted with either one of the first or the second format conversion form. As for other forms, it does not matter if these format conversion forms are made to be selectable forms (forms where both types of format conversion forms are mounted) by the resister setting and the like.

First, the case of using the first format conversion form 507 of FIG. 6A will be described. In the first selecting condition, in other words, in a format conversion (A format) 507-1 with a condition where both the chrominance difference information (|U1−U2| and |V1−V2|) on the horizontal two pixels are not less than the corresponding threshold values (Tu, Tv) similarly to the B format 109-2 in the first embodiment, the luminance information is reduced by the low order two bits of each pixel, and the chrominance information is reduced by the lower three bits of each pixel (Y1[7:2] & Y2[7:2], U1[7:3] & U2[7:3], and V1[7:3] & V2[7:3]).

Next, in the second selecting condition, in other words, in a conversion (B format) 507-2 with a condition where the U data difference information (|U1−U2|) on the horizontal two pixels only is not less than the threshold value (Tu), since the difference (|V1−V2|) of the V data is small, the V data is stored as six bits by further reducing the data ((V1+V2)/2) given by averaging the horizontal two pixels by the lower two bits. Since the difference of the U data is large, in each pixel of the horizontal two pixels, the low order three bits are reduced and stored in the memory (U1[7:3] & U2[7:3]). The luminance (Y) data is stored without the information amount in each pixel of the horizontal two pixels is not reduced (Y1[7:0] & Y2[7:0]).

Next, in the third selecting condition, in other words, in the format conversion (C format) 507-3 with a condition where the V data difference information (|V1−V2|) of the horizontal two pixels only is not less than the threshold value (Tv), since the difference (|U1−U2|) of the U data is small, the U data is stored as six bits by further reducing the data ((U1+U2)/2) given by averaging the horizontal two pixels by the lower two bits. Since the difference of the U data is large, in each pixel of the horizontal two pixels, the low order three bits are reduced and stored in the memory (V1[7:3] & V2[7:3]). The luminance (Y) data is stored without the information amount in each pixel of the horizontal two pixels is not reduced (Y1[7:0] & Y2[7:0]).

Finally, in the fourth selecting condition, in other words, in a format conversion (D format) 507-4 with a condition where both the chrominance difference information (|U1−U2| and |V1−V2|) on the horizontal two pixels are smaller than the corresponding threshold values (Tu, Tv), similarly to the YUV 422 format in the first embodiment, each pixel stored the luminance information without reducing the amount of information (Y1[7:0] & Y2[7:0]), and the chrominance information becomes an averaged value of the horizontal two pixels {(U1+U2)/2 and (V1+V2)/2}.

Next, each format conversion in the case where the second format conversion form 508 of FIG. 6B is used will be described. First, the formation conversion (A format) 508-1 of the first selecting condition and the format conversion (D format) 508-4 of the fourth selecting condition are the same as the case of the first format conversion form 507 (507-1 and 507-4).

Next, in the format conversion (B format) 508-2 in the case of the second selecting condition, since the difference of the V data (|V1−V2|) is small, the V data is stored as six bits by further reducing the data ((V1+V2/2) that was given by averaging the horizontal two pixels by the low order two bits. Here, as the different point with the first format conversion form 507, the luminance (Y) data is stored with reducing one bit in each pixel of the horizontal two pixels (Y1[7:1] & Y2[7:1]), and by that much portion, the U data can increase the data storing amount, and the U data is stored in the memory 106 by reducing the low order two bits (U1[7:2]& U2[7:2]).

In the format conversion (C format) 508-3 also in the case of the third selecting condition, with the same consideration given to the format conversion 508-2 in the second selecting condition, the U data is stored as six bits by further reducing the data ((U1+U2)/2) that was given by averaging the horizontal two pixels by the low order two bits, and the luminance (Y) data is stored with reducing one bit in each pixel of the horizontal two pixels (Y1[7:1] & Y2[7:1]), and by that much portion, the V data is stored in the memory 106 by reducing the low order two bits (V1[7:2] & V2[7:2]).

In the A conversion unit 501 through the D conversion unit 504, the YUV format data converted by either one of the two types of the format conversion forms is selected based on the Mode bit outputted from the formation judging unit 500, and is stored in the memory 106 together with the Mode bit that is the YUV formation information (d3).

As a result, the YUV format data at each selecting condition in the second embodiment is 32 bits in the horizontal two pixels, and together with the Mode bit of two bits, a total of 34 bits is stored in the memory 106 per horizontal two pixels. Hence, as compared with the input display data 48 bits/2 pixels, about 30 percent of the data amount can be reduced.

Next, the YUV format data and the Mode bit outputted from the memory 106 are YUV-RGB converted based on the Mode bit in the RGB conversion unit 506, and output RGB data for the horizontal two pixels, and are serialized in the P/S conversion unit 108, thereby outputting the RGB data for one pixel each (d2).

By the above described data processing procedure, the input RGB data realizes a memory compressibility (reduction of the data amount by about 30 percent) which is equal to the YUV 422 format, and moreover, by selecting the YUV format based on the data, the input output data error amount can be markedly reduced as compared with the case where the memory compression is performed by the conventional YUV 422 format only.

Next, with reference to FIGS. 7A and 7B, the advantageous effect of the reduction in the image degradation by the memory compression system in the second embodiment will be described. In a first example shown in FIG. 7A, when the display image is made of QVGA resolution and RGB 24 bits, the case will be shown as an example, where a display image 600 is made of vertical stripes of cyan (C) data (R=0, G=199, B=199) and green (GR) data (R=0, G=252, B=0).

Next, in a second example shown in FIG. 7B, when the display image is made of QVGA resolution and RGB 24-bits, the case will be shown where a display image 605 is made of vertical stripes of yellow (YEL) data (R=153, G=153, B=0) and green (GR) data (R=0, G=252, B=0).

In the first example shown in FIG. 7A and the second example shown in FIG. 7B, in a case where the threshold value adapted for judgment is 16 for both the U difference and the V difference, and in a case where the threshold value adapted for judgment is 4 for both the U difference and the V difference, the difference in the image degradation due to the difference in the YUV format is also compared and shown.

First, the first example shown in FIG. 7A will be described. When the data compression by the YUV 422 format of the conventional method is performed for the display image 600 which is the original display data without data compression, a display image 601 is outputted according to the data flow as described in the first embodiment. As shown in the display image 601, the cyan data is (R=0, G=220, B=94), and the green data is (R=3, G=228, B=102).

Hence, the display image 601 after the data compression by the conventional method has the cyan data shifted by 21 gradations in the G data, and by 105 gradations in the B data, and further, the green data has shifted by three gradations in the R data, by 24 gradations in the G data, and by 102 gradations in the B data. As a result, it is clear that the display images of the cyan and green stripes come off the color balance due to data error and are remarkable in image degradation.

On the other hand, when the processing is performed by each of the first and second format conversion forms (507 and 508) in the second embodiment, first, the YUV data of the horizontal two pixels is elicited, the first pixel becomes (Y1, U1, V1)=(139, 33, −99), and the second pixel becomes (Y2, U2, V2)=(147, −83, −105).

Here, since the chrominance (U, V) data difference becomes |U1−U2|=116 and |V1−V2|=6, when the threshold values of the U difference and the V difference are set to 16, the selecting condition becomes the second selecting condition, that is, the B format by the B conversion is selected. With respect to the display image after the memory compression, the display image 602 of the first format conversion form 507 has a cyan data (R=0, G=199, B=195) and a green data (R=6, G=245, B=5), and the display image 603 of the second format conversion form 508 has a cyan data (R=0, G=198, B=194), and the green data becomes (R=5, G=244, B=4).

From the above description, in the case of the first format conversion form 507, the cyan data is shifted by 4 gradations in the B data, and the green data is shifted by six gradations in the R data, by seven gradations in the G data, and by five gradations in the B data. In the case of the second format conversion form 508, the cyan data is shifted by one gradation in the G data, and by five gradations in the B data, and the green data is shifted by five gradations in the R data, by eight gradations in the G data, and by four gradations in the B data. Hence, when the threshold value is 16, it is clear that the data error difference is small in any format conversion form.

On the other hand, when the threshold values of the U difference and the V difference are 4, the selecting condition becomes the first selecting condition, that is, the A format by the A conversion is selected. Hence, the display image after the memory compression becomes a display image 604 by both the first and second format conversion forms (507 and 508). In the display image 604, the cyan data becomes (R=0, G=193, B=192), and the green data becomes (R=0, G=245, B=2).

From the above description, in the cases of both the first and second format conversion forms (507 and 508), the cyan data is shifted by six gradations in the G data and by seven gradations in the B data, and the green data is shifted by seven gradations in the G data and by two gradations in the B data. Hence, even when the threshold value is 4, it is clear that the data error difference is small as compared with the conventional method.

Next, the second example shown in FIG. 7B will be described. It is clear that a display image 606 where the data compression is performed by the YUV 422 format of the conventional method is, similarly to the first example, more of data error difference amount from the original image, and is large in image degradation as compared to the display image 605 which is the original display data without data compression.

On the other hand, when the processing is performed by each of the first and second format conversion forms (507 and 508) in the second embodiment, since it is clear that the U difference=7, and the V difference=105 from a chrominance data difference result by the same data calculation as the first example, in case both the U difference and the V difference are made to be 16, the selecting condition becomes the third selecting condition (C format by C conversion).

As a result, in the first format conversion form 507, the display image becomes a display image 607, and in the second format conversion for 508, the display image becomes a display image 608, and similarly to the first example, when the threshold value is 16, it is clear that the data error difference is small in either case of the first and second format conversion forms.

When the threshold value of both the U difference and the V difference is 4, the selecting condition becomes the first selecting condition (A format by A conversion). As a result, both the first and second format conversion forms become a display image 609, and therefore, even when the threshold value is taken as 4, similarly to the first example, the data error difference from the original image is small as compared with the conversion of the conventional method.

The configuration of the liquid crystal display device and the display system including the display drive circuit of the second embodiment is the same as that of FIG. 4.

As described above, in the second embodiment, similarly to the first embodiment, the compressibility equal to the memory compression system by the conventional YUV 422 format can be realized, and the data error difference with the original image is remarkably small as compared with the conventional method.

Third Embodiment

Figure 8A:
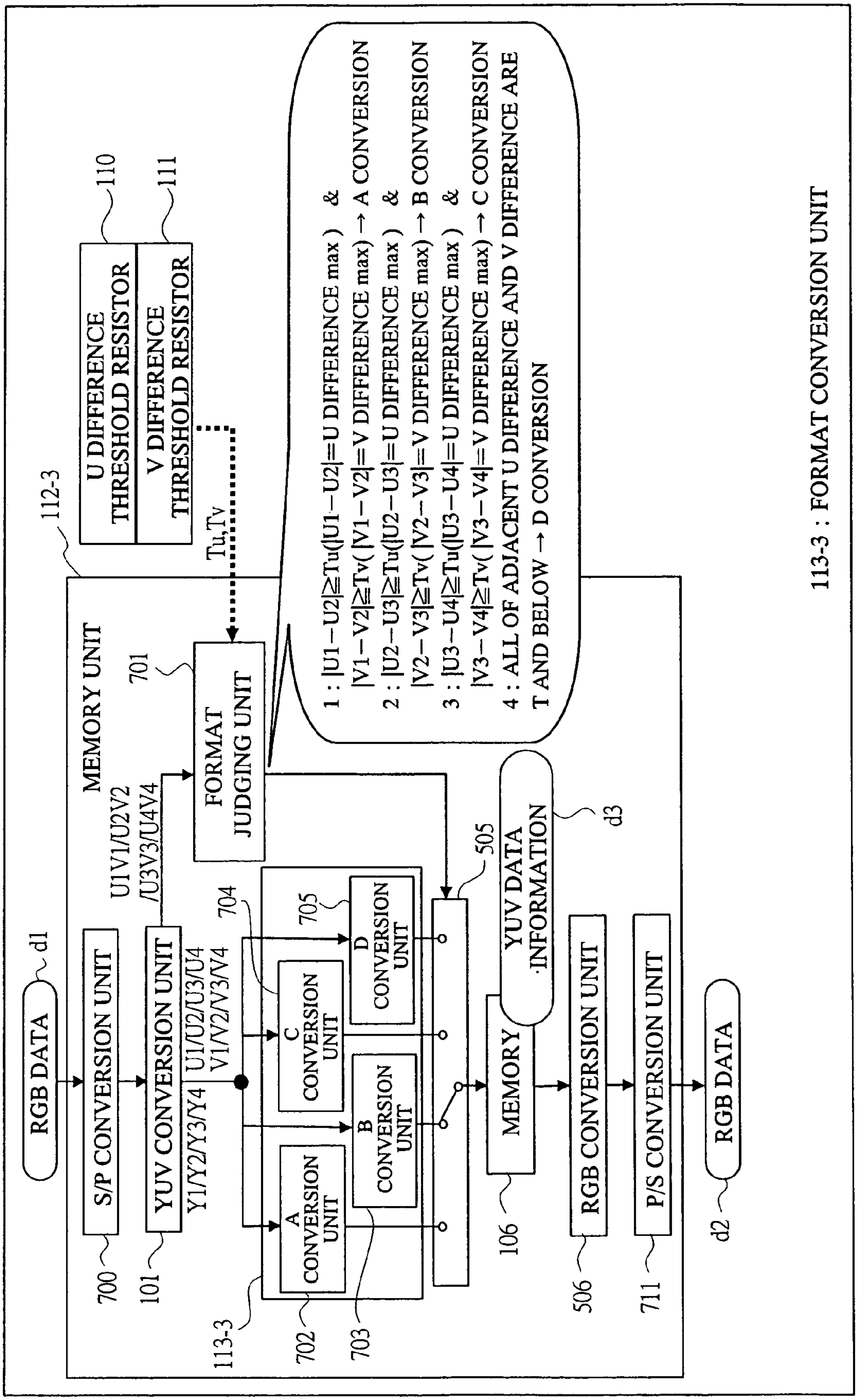
FIG. 8A is a block diagram regarding a memory control and processing method in the display drive circuit of a third embodiment of the present invention.
Figure 8B:
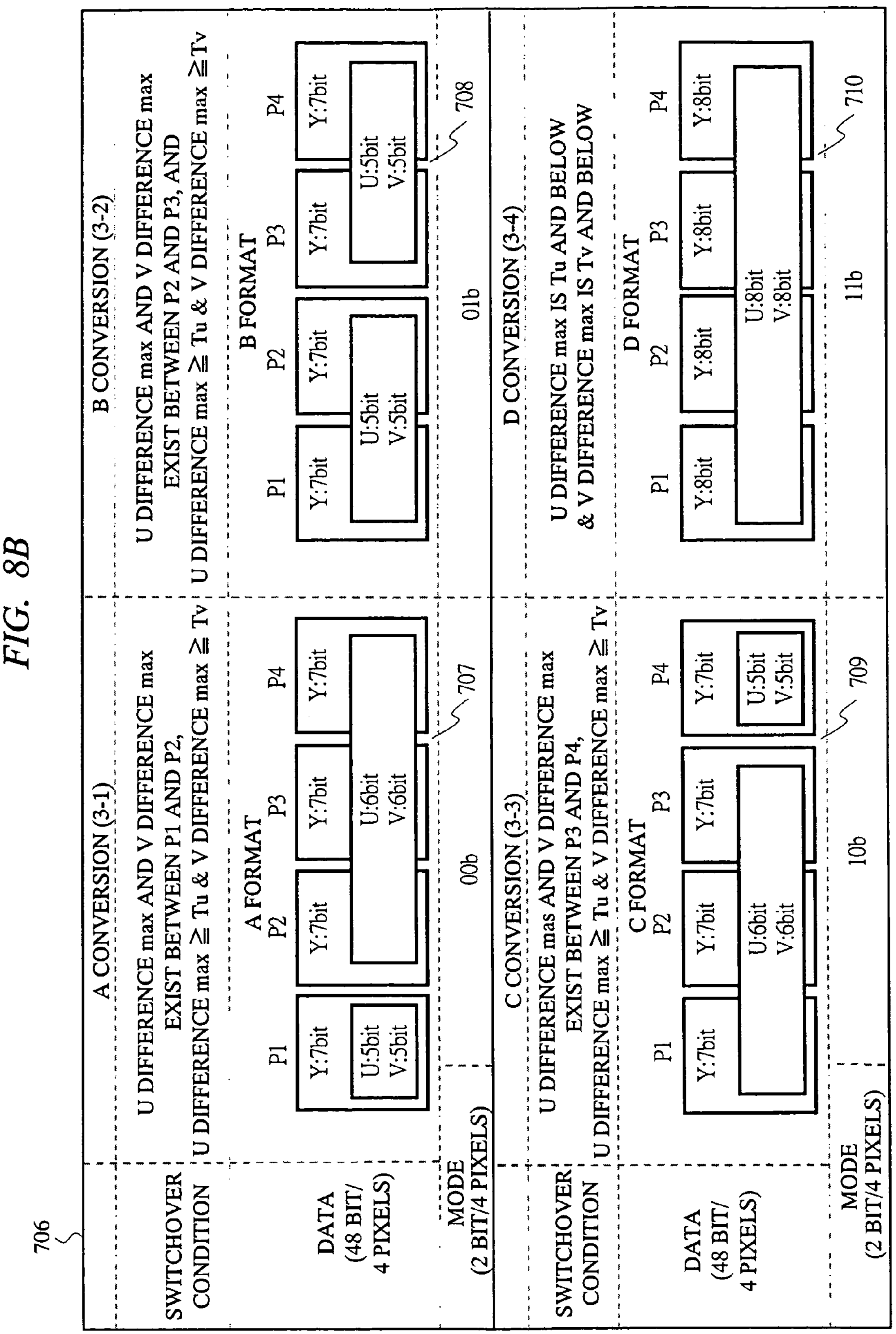
FIG. 8B is an explanatory drawing showing the YUV format conversion in the display drive circuit of the third embodiment of the present invention.

Next, a third embodiment of the present invention will be described with reference to FIGS. 8A and 8B, and the above described FIGS. 2 and 4. FIG. 8A shows a block configuration of a memory unit 112-3 in a display drive circuit of the third embodiment similarly to the first embodiment. FIG. 8B shows format conversion contents, selecting conditions, and the like in a memory storage data processing in the third embodiment.

In the first and second embodiments, though the YUV format data to be selected was for horizontal two pixels, in the third embodiment, the YUV format data to be selected is for adjacent horizontal four pixels (taken as P1 to P4) so that the data amount to be reduced is increased, thereby making it the YUV format switchover data compression system that further increases compressibility.

First, a memory control and processing method in the display drive circuit in the present third embodiment will be described with FIGS. 8A and 8B. In FIG. 8A, the inner configuration is described. In the memory unit 112-3, based on chrominance (U, V) information on the horizontal four pixels, the processing of a memory compression system that selects the YUV data format to be stored in a memory 106 is performed. In this system, the YUV data format to be selected is assumed to be a YUV format given by averaging the chrominance (U, V) data of the four pixels when the chrominance (U, V) data differences between adjacent pixels are small. In general, this format is called as a YUV 411 format. In the following, it is referred to as a YUV 411 format. In the case of the YUV 411 format, when the data error difference due to averaging of the chrominance (U, V) is large, the averaging of the chrominance data is performed by dividing the pixels into two areas, left and right by the adjacent pixels with largest chrominance data difference among the four pixels, thereby making the YUV data format that makes the amount of data error difference small.

Specific realizing means is described below. A description is made on the case where the data to be inputted is 24 bits RGB data. First, the YUV format data to be stored in the memory 106 is assumed to select a YUV format based on the chrominance difference information (|U1−U2|, |U2−U3|, |U3−U4|, |V1−V2|, |V2−V3|, |V3−V4|) on the adjacent horizontal four pixels {P1(Y1, U1, V1) to P4 (Y4, U4, V4)} of the display data.

The selecting condition at the time of above described selecting time is separated by the following first to fourth selecting conditions. The first selecting condition is such that, among the adjacent U data differences, |U1−U2| is the maximum U data difference (U difference max), and among the adjacent V data differences, |V1−V2| is the maximum V data difference (V difference max), and both |U1−U2| and |V1−V2| are not less than the threshold values (Tu, Tv). The second selecting condition is such that, among the adjacent U data differences, |U2−U3| is the maximum U data difference, and among the adjacent V data differences, |V2−V3| is the maximum V data difference, and both |U2−U3| and |V2−V3| are not less than the threshold values (Tu, Tv). The third selecting condition is such that, among the adjacent U data differences, |U3−U4| is the maximum U data difference, and among the adjacent V data differences, |V3−V4| is the maximum V data difference, and both |U3−U4| and |V3−V4| are not less than the threshold values (Tu, Tv). The fourth selecting condition is such that all of the adjacent U differences (|U1−U2|, |U2−U3|, |U3−U4|) and the adjacent V differences (|V1−V2|, |V2−V3|, |V3−V4|) of the four pixels are not more than the threshold values (Tu, Tv).

At the time of the first to third selecting conditions, the luminance data is reduced at the low order one bit of each of the four pixels, and about the chrominance (U, V) data, the pixels are divided into the left pixel area and the right pixel area where the chrominance difference information therebetween is largest, that is, in the first selecting condition: between P1 and P2, in the second selecting condition: between P2 and P3, and in the third selecting condition: between P3 and P4, respectively, thereby making a format given by averaging the chrominance (U, V) at each area. At the time of the fourth selecting condition, the data is stored in the memory 106 by the YUV 411 format.

With the configuration described above, the YUV information amount is reduced as compared with the first and second embodiments, and the data compressibility of about 50% is realized for the input data, and similarly to the first and second embodiments, the selecting format is changed by the chrominance information, so that it is possible to reduce the image degradation.

In the memory unit 112-3, an S/P conversion unit 700 for the input data performs parallelization for performing a parallel processing by the four pixels for the input data per one pixel unit. Similarly, with respect to a P/S conversion unit 711 for the output pixel, serialization is performed for the four pixel data per one pixel unit. The YUV data for the horizontal four pixels that is parallelized is processed in an A conversion unit 702 through a D conversion unit 705 in a format conversion unit 113-3. In the format conversion unit 113-3, the YUV conversion is performed by a format conversion form 706 in the third embodiment shown in FIG. 8B.

With respect to the format judgment unit 701 inputted with the YUV data format to be stored in the memory 106, judgment and selection are performed regarding the first to fourth selecting conditions. With respect to a Mode bit outputted from the format judgment unit 701, in the case of the first selecting condition the Mode bit is taken as 2'b00, and in the case of the second selecting condition the Mode bit is taken as 2'b01, and in the case of the third selecting condition the Mode bit is taken as 2'b10, and in the case of the fourth selecting condition, the Mode bit is taken as 2'b11.

In FIG. 8B, an A format 707 reduces luminance information by the low order one bit of each pixel, and chrominance (U, V) information is a format (50 bits/4 pixels) that reduces the low order three bits of P1, averages P2 to P4 and reduces the low order two bits thereof. A B format 708 reduces luminance information by the low order one bit of each pixel, and the chrominance (U, V) information is a format (48 bits/4 pixels) that averages P1 to P2 and reduces the low order three bits thereof, and averages P3 to P4 and reduces the low order three bits thereof. A C format 709 reduces luminance information by the low order one bit of each pixel, and the chrominance (U, V) information is a format (50 bits/4 pixels) that averages P1 to P3 and reduces the low order two bits thereof, and reduces the low order three bits of P4. A D format 710 stores the luminance information without reducing the information amount from each pixel, and the chrominance information is a value given by averaging thereof of the horizontal four pixels.

Other components such as a YUV unit 101, the switch unit (4TO1 selector switch) 505, the memory 106, and the RGB conversion unit 506 are basically the same as the functions described in the first and second embodiments.

The resistor setting in the third embodiment is the same as that shown in FIG. 2. The liquid crystal display device and the display system configuration in the third embodiment are the same as FIG. 4. Although a description has been made on the horizontal four pixels as the pixels to be YUV-formatted in the third embodiment, it does not matter even if the embodiment is such that this number of pixels is changed to other number of pixels.

In the case of the configuration of the memory unit 112-3 in the third embodiment as described above, the data amount stored in the memory 106 can be made about 50% of the data for the input data, and by selecting the YUV format where the image degradation is reduced by the YUV data error difference in the compression and expansion of the input data, low cost and high image quality can be achieved together.

Fourth Embodiment

Figure 9A:
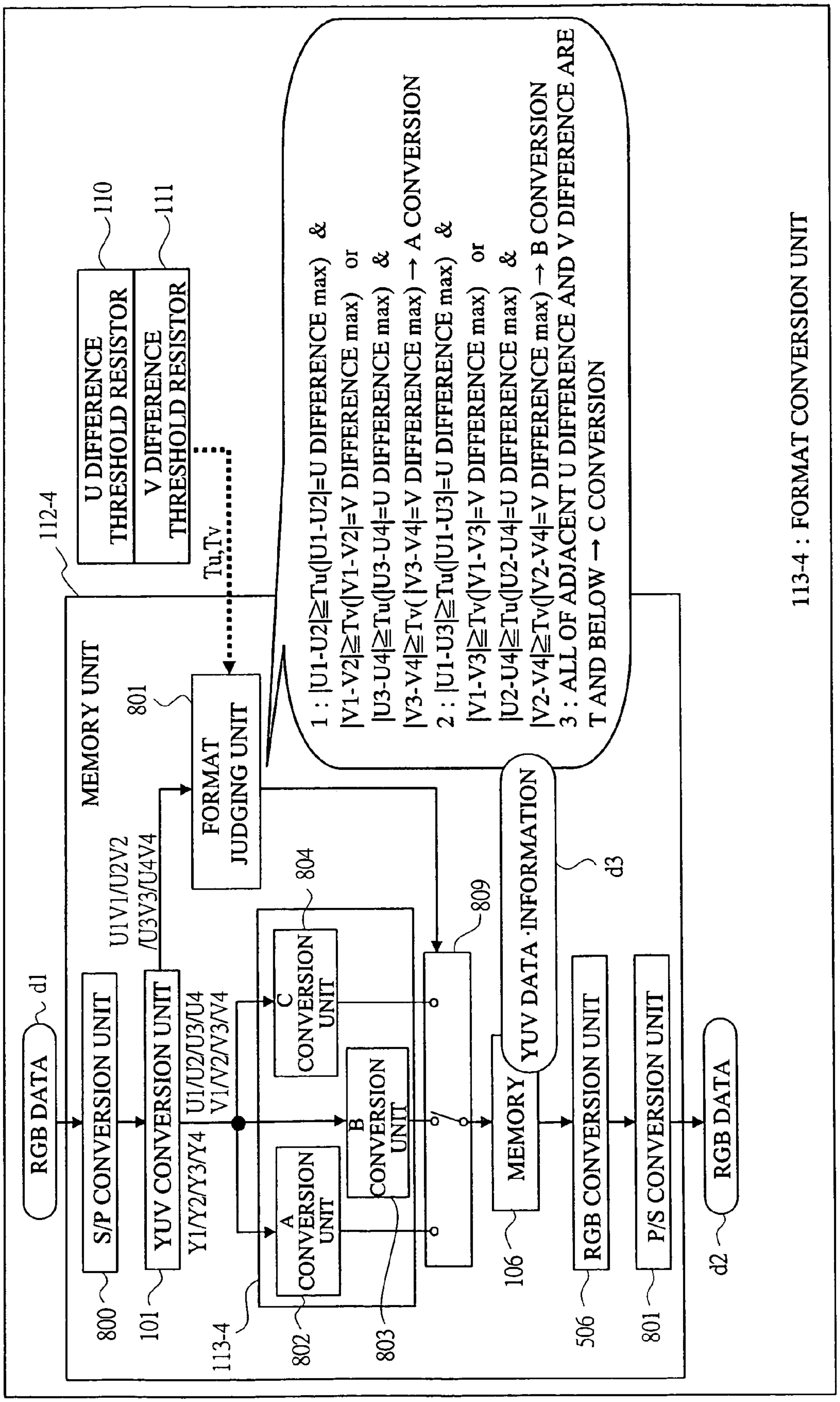
FIG. 9A is a block diagram regarding a memory control and processing method in the display drive circuit of a fourth embodiment of the present invention.
Figure 9B:
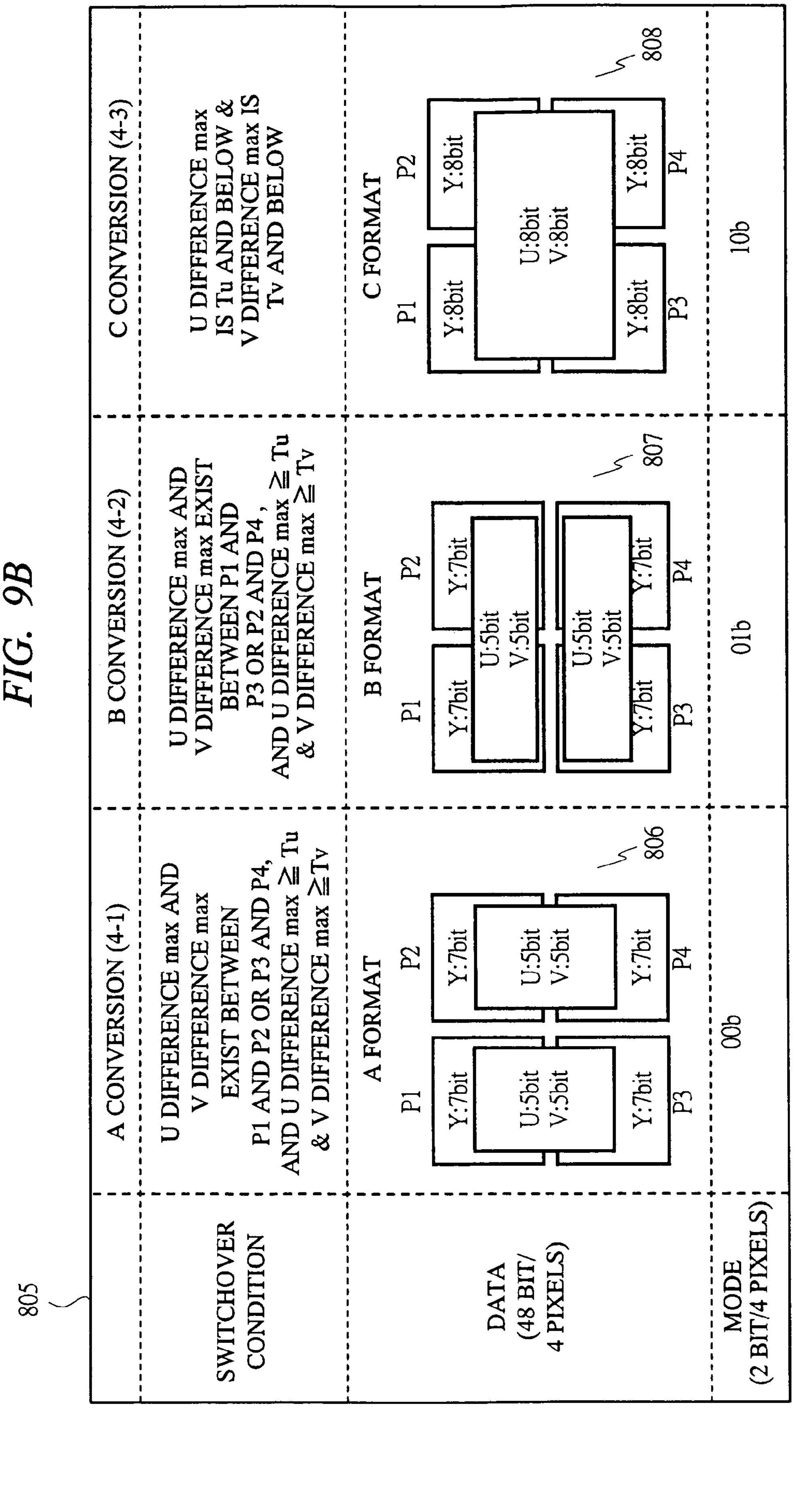
FIG. 9B is an explanatory diagram showing the YUV format conversion in the display drive circuit of the fourth embodiment of the present invention.

Next, a fourth embodiment of the present invention will be described with reference to FIGS. 9A and 9B, and the above described FIGS. 2 and 4. FIG. 9A shows a block diagram of a memory unit 112-4 in a display drive circuit of the fourth embodiment similarly to the first embodiment. FIG. 9B shows format conversion contents, selecting conditions, and the like in memory storage data processing in the fourth embodiment similarly to the first embodiment.

In the first and second embodiments, though the YUV format data to be selected has been taken as a horizontal two pixel portion, in the fourth embodiment, the YUV format data to be selected is taken as a total of four pixels (block) of the horizontal two pixels (P1, P2) and vertical two pixels (P3, P4), so that the data to be reduced is increased. As a result, this is taken as a YUV format switchover data compression system that further increases compressibility. Furthermore, with a block-type YUV format with a horizontal two pixels and vertical two pixels, image degradation is reduced in consideration of image degradation in the vertical direction.

First, a memory control and processing method in the display drive circuit in the present fourth embodiment will be described. In FIG. 9A, the inner configuration is described. In the memory unit 112-4 in the fourth embodiment, based on chrominance (U, V) information on the horizontal two pixels and vertical two pixels, the processing of a memory compression system that selects the YUV data format to be stored in a memory 106 is performed. In this system, the YUV data format to be selected is assumed to be a YUV format given by averaging the chrominance (U, V) data of the four pixels when the chrominance (U, V) data difference from adjacent pixels is small. In general, this format is called as a YUV 420 format. In the following, it is referred to as a YUV 420 format. In the case of the YUV 420 format, when the data error difference due to averaging of the chrominance (U, V) is large, the averaging of the chrominance data is performed by dividing the pixels into two areas, left and right by the adjacent pixel that is the largest in chrominance data difference from among the four pixels, thereby realizing the YUV data format that makes the data error difference amount small.

Specific realizing means will be described below. A description will be made on the case where the data to be inputted is 24 bits RGB data. First, the YUV format data to be stored in the memory 106 is assumed to select a YUV format based on the block of the adjacent four pixels (P1 (Y1, U1, V1) to P4 (Y4, U4, V4)) of the display data of the chrominance |V2−V3|, |V3−V4|).

The selecting condition at the selecting time is separated by the following first to third selecting conditions. The first selecting condition is such that, among the adjacent U data differences, |U1−U2| or |U3−U4| is the maximum U data difference, and among the adjacent V data difference, |V1−V2| or |V3−V4| is the maximum V data difference, and |U1−U2| or |U3−U4| and |V1−V2| or |V3−V4| are not less than the threshold values.

The second selecting condition is such that, among the adjacent U data differences, |U1−U3| or |U2−U4| is the maximum U data difference, and among the adjacent V data differences, |V1−V3| or |V2−V4| is the maximum V data difference, and |U1−U3| or |U2−U4| and |V1−V3| or |V2−V4| are not less than the threshold values.

The third selecting condition is such that all of the adjacent U differences (|U1−U2|, |U1−U3|, |U2−U4|, |U3−U4|) and the adjacent V differences (|V1−V2|, |V1−V3|, |V2−V4|, |V3−V4|) of the four pixels are not more than the threshold values.

At the time of the first selecting condition, the luminance data is reduced at the low order one bit of each of the four pixels, and about the chrominance (U, V) data, the pixels are divided into the left pixel area and the right pixel area where the chrominance difference information is the largest, that is, between P1 and P2 or between P3 and P4, thereby realizing a format given by averaging the chrominance (U, V) at each area. At the time of the second selecting condition, the luminance information is reduced at the low order one bit of the four pixels each, and about the chrominance (U, V) data, the pixels are separated into the upper area and the lower area where the chrominance difference information is the largest, that is, between P1 and P3 or between P2 and P4, thereby realizing the format given by averaging the chrominance (U, V) at each area. At the time of the third selecting condition, luminance data is stored in the memory 106 by the YUV 420 format.

With the configuration described above, as compared with the first and second embodiments, the YUV information amount is reduced, and the data compressibility of about 50% to the input data is realized, and similarly to the first and second embodiments, the selecting format is changed by the chrominance information, so that it is possible to reduce the image degradation.

In the configuration of the memory unit 112-4, an S/P conversion unit 800 for the input data performs parallelization for the four pixels to perform a parallel processing for the input data per one pixel unit. Similarly with respect to a P/S conversion unit 810 for the output pixel, serialization is performed for the four pixel data per one pixel unit. At this time, since the input data is continuously inputted with the data for vertical two lines, in the preliminary processing for the data to be inputted into the memory unit 112-4, a line memory is required. The YUV data of the parallelized four pixels are processed in an A conversion unit 802 through C conversion unit 804 of the format conversion unit 113-4.

With respect to the format judgment unit 801 inputted with the YUV data format to be stored in the memory 106, judgment and selection are performed regarding the first to third selecting conditions. With respect to a Mode bit outputted from the format judgment unit 801, in the case of the first selecting condition the Mode bit is taken as 2'b00, and in the case of the second selecting condition the Mode bit is taken as 2'b01, and in the case of the third selecting condition the Mode bit is taken as 2'b10.

In FIG. 9B, an A format 806 reduces luminance information by the low order one bit of each pixel, and chrominance (U, V) information is a format that averages P1 and P3 and reduces the low order three bits thereof, and averages P2 to P4 and reduces the low order three bits thereof. A B format 807 reduces luminance information by the low order one bit of each pixel, and the chrominance (U, V) information is a format that averages P1 to P2 and reduces the low order three bits thereof, and averages P3 to P4 and reduces the low order three bits thereof. A D format 808 stores the luminance information without reducing the information amount from each pixel, and the chrominance information is a value given by averaging the four pixels.

Other components such as a YUV unit 101, the memory 106, a switch unit (3TO1 switch) 809, and the RGB conversion unit 506 are basically the same as the functions described in the first and second embodiments.

The resistor setting in the fourth embodiment is the same as that shown in FIG. 2. The liquid crystal display device and the display system configuration in the fourth embodiment are the same as FIG. 4. Although a description has been made on the block of the four pixels of the horizontal two pixels and the vertical two pixels as the pixels to be YUV-formatted in the forth embodiment, there is no problem even if the embodiment is such that this number of pixels is changed to other number of pixels.

In the case of the configuration of the memory unit 112-4 in the fourth embodiment as described above, the data amount stored in the memory 106 can be made about 50% of the data for the input data, and by selecting the YUV format where the image degradation by the YUV data error difference in the compression and expansion of the input data is reduced, the low cost and high image quality can be achieved together.

In each of the above described embodiments, though a description has been made with the liquid crystal display device 400 as a premise, the embodiment is not limited to this, but can be applied to other display devices that control the display luminance depending on the voltage to be applied, for example, an organic EL display and the like. In each of the embodiments, for ease of explanation, though a concept regarding reversal of polarity drive necessary for the drive of the liquid crystal and the like has been omitted, the embodiment can be easily applied to various types of systems such as common inversion, each column inversion, dot inversion, and common inversion drive. Although a form has been applied where the number of bits of the display data is eight bits for each RGB, the number is not limited to this. In each of the embodiments, though a description has been made on the assumption that the U and V difference threshold value information regarding the adjustment of the YUV format is stored in the resistors (110, 111), it is not limited to this, but for example, may be a terminal setting (without the resistors). Although the memory unit 112 is configured on the assumption that it is configured within the driver, that is, within the signal line drive circuit 402, it is not limited to this, but may be a form with the memory 106 connected externally. In the case where a bridge chip is configured between the MPU 411 and the signal line drive circuit 402, a component equivalent to the memory may be configured within the bridge chip. Further, though the format of the data to be stored in the memory is taken as the YUV format, other type of the format may be applicable.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention can be used for a digital display device and system that performs a display by processing digital signals.

What is claimed is:

1. A display driver for inputting a display data of a first format and outputting a voltage corresponding to the display data to a display element of a display panel, comprising:

a data compression circuit for converting the display data of the first format to be inputted from the outside into a second format;

a storage circuit for storing the display data of the second format;

a data expansion circuit for conversing the display data of the second format into the first format;

a voltage generating circuit for generating a plurality of voltages corresponding to a plurality of gradations showing the display data of the first format; and a voltage selecting circuit for selecting the voltage corresponding to the display data of the first format from the plurality of voltages;

wherein, the second format converted by the data compression circuit has a plurality of types different in data amount, and further comprising:

a circuit for selecting any one from the second formats of the plurality of types according to the information on a plurality of adjacent pixels in the display data of the first format, and storing the display data converted into the selected second format in the storage circuit.

2. The display driver according to claim 1, wherein the first format is an RGB format, and the second format is a YUV format.

3. The display driver according to claim 1, wherein the second format is a YUV format, and the data compression circuit, according to chrominance difference information on the plurality of adjacent pixels in the display data, selects the YUV format of the display data to be stored in the storage circuit from the YUV formats of the plurality of types.

4. The display driver according to claim 1, wherein the second format is a YUV format, and further comprising:

a circuit for detecting the chrominance difference information on the plurality of adjacent pixels in the display data, based on the display data of the first format, making a comparison by using threshold information for comparing a size relationship with the chrominance difference information, and based on the result thereof, selecting the YUV format of the display data to be stored in the storage circuit from the YUV formats of the plurality of types, wherein the threshold value information used in the selecting circuit is stored into the display driver.

5. The display driver according to claim 4, wherein the threshold value information is values showing a difference of an U component and a difference of a V component of adjacent horizontal two pixels in the display data, wherein the selecting circuit detects chrominance difference information on the U component and the V component of the adjacent horizontal two pixels in the display data, and the detected information and the threshold value information are compared in terms of the U component and V component respectively, and according to the size relationship of those components, the YUV format of the display data to be stored in the storage circuit is selected.

6. The display driver according to claim 5, wherein the YUV format is a format that has a data showing Y, U, V components by a plurality of bits respectively in the plurality of adjacent pixels in the pixels in a horizontal direction and a vertical direction that configure a frame, among the YUV formats of the plurality of types, the first YUV format is a format that has a data thinning out a plurality of low order bits of each data bit showing a Y component, U component, and V component of each pixel of the adjacent horizontal two pixels, the second YUV format is a format that has the data of the Y component of each pixel of the adjacent horizontal two pixels, and the data of the component averaging the U component of the each pixel and the data of the component averaging the V component, and in the selection in the first and second YUV formats, the conversion to the second YUV format is selected when both pieces of the chrominance difference information on the U and V components are smaller than the threshold value, and the conversion to the first format is selected when either one piece of the chrominance difference information on the U and V components is larger than the threshold value.

7. The display driver according to claim 1, wherein the display data of the second format to be stored in the storage circuit is stored in the storage circuit together with the information for identifying the second format selected from among the second formats of the plurality of types, the data expansion circuit, when processing the display data stored in the storage circuit, refers to the information for identifying the second format, thereby recognizing the second format of the display data.

8. A display driver for inputting a display data of a first format and outputting a voltage corresponding to the display data to the display element of the display panel, comprising:

a data compression circuit for converting the display data of the first format to be inputted from the outside into a second format;

a storage circuit for storing the display data of the second format;

a data expansion circuit for converting the display data of the second format into the first format;

a voltage generating circuit for generating a plurality of voltages corresponding to a plurality of gradations showing the display data of the first format; and a voltage selecting circuit for selecting the voltage corresponding to the display data of the first format from the plurality of voltages;

the display driver comprising a resistor circuit for storing a set value of the threshold value for comparing with the component of the display data, wherein the second format by the conversion in the data compression circuit has a plurality of types different in data amount, and further comprising:

a circuit for selecting any one from the second formats of the plurality of types according to the comparison with the information on the plurality of adjacent pixels in the display data of the first format and the threshold value set in the resister circuit, is selected, and a circuit is provided in the storage circuit for storing the display data converted into the selected second format in the storage circuit.

9. The display driver according to claim 8, wherein the first format is an RGB format, and the second format is a YUV format.

10. The display driver according to claim 8, wherein the second format is a YUV format, and the data compression circuit selects the YUV format of a display data to be stored in the storage circuit from the YUV formats of the plurality of types according to the chrominance difference information on the plurality of adjacent pixels in the display data.

11. The display driver according to claim 8, wherein the second format is a YUV format, further comprising:

a circuit for detecting the chrominance difference information on the plurality of adjacent pixels in the display data based on the display data of the first format, making a comparison by using threshold value information for comparing a size relationship with the chrominance difference information, and based on the result thereof, selecting the YUV format of the display data to be stored in the storage circuit from the YUV formats of the plurality of types, and wherein the threshold value information used in the selecting circuit is inputted with the set value of the resistor circuit.

12. The display driver according to claim 11, wherein the threshold value information is values showing a difference of an U component and a difference of a V component of adjacent horizontal two pixels in the display data, and the selecting circuit detects chrominance difference information on the U component and the V component of the adjacent horizontal two pixels in the display data, and the detected information and the threshold value information are compared in terms of the U component and V component, respectively, and according to the size relationship of those components, the YUV format of the display data to be stored in the storage circuit is selected.

13. The display driver according to claim 12, wherein the YUV format is a format that has a data showing Y, U, V components by a plurality of bits respectively in the plurality of adjacent pixels in the pixels in a horizontal direction and a vertical direction that configure a frame, among the YUV formats of the plurality of types, the first YUV format is a format that has a data thinning out a plurality of low order bits of each data bit showing a Y component, U component, and V component of each pixel of the adjacent horizontal two pixels, the second YUV format is a format that has the data of the Y component of each pixel of the adjacent horizontal two pixels, and the data of the component averaging the U component of the each pixel and the data of the component averaging the V component, and in the selection in the first and second YUV formats, the conversion to the second YUV format is selected when both pieces of the chrominance difference information on the U and V components are smaller than the threshold value, and the conversion to the first YUV format is selected when either one piece of the chrominance difference information on the U and V components is larger than the threshold value.

14. The display driver according to claim 8, wherein the display data of the second format to be stored in the storage circuit is stored in the storage circuit together with the information for identifying the second format selected from the second formats of the plurality of types, and the data expansion circuit, when processing the display data stored in the storage circuit, refers to the information for identifying the second format, thereby recognizing the second format of the display data.

15. The display driver according to claim 8, wherein the set value of the threshold value in the resistor circuit can be changed in setting from the outside of the display driver.

16. A display driver for outputting a voltage corresponding to the display data inputted from the outside to a display panel, comprising:

a first conversion circuit for converting a display data of a first format from the outside into a second format;

a storage circuit for storing the display data of the second format from the first conversion circuit;

a second conversion circuit for converting the display data of the second format from the storage circuit into the first format;

a voltage generating circuit for generating a plurality of voltages corresponding to a plurality of display data; and a voltage selecting circuit for selecting a voltage corresponding to the display data of the first format from the second conversion circuit from among the plurality of voltages, wherein, the first conversion circuit, according to the display data of the first or second format, selects a data reduction method of the display data of the second format to be stored into the storage circuit from among a plurality of different data reduction methods, and according to the selected data reduction method, converts the display data of the second format, thereby reducing the data amount.

17. A display driver for outputting a voltage corresponding to the display data inputted from the outside to a display panel, comprising:

a first conversion circuit for converting the display data of the RGB format from the outside into a YUV format;

a storage circuit for storing the display data of the YUV format from the first conversion circuit;

a second conversion circuit for converting the display data of the second format from the storage circuit into the RGB format;

a voltage generating circuit for generating a plurality of voltages corresponding to a plurality of display data; and a voltage selecting circuit for selecting the voltage according to the display data of the RGB format from the second conversion circuit from among the plurality of voltages;

wherein, the first conversion circuit, according to a U component and a V component of the display data of the YUV format, selects a data compression method of the display data of the YUV format to be stored into the storage circuit from among a plurality of data compression methods, and according to the selected data compression method, compresses the display data of the YUV format.

18. A display driver comprising a memory for storing a display data and memory control circuit for controlling the memory, and driving a display panel by a voltage corresponding to the display data, wherein, the memory control circuit executes:

a processing for serial/parallel converting the display data of an inputted RGB format and converting the same into the display data of a YUV format a processing for selecting any one of the format converting methods of a plurality of types according to a size relationship by chrominance difference information in the plurality of adjacent pixels in the display data of the YUV format and comparison judgment with threshold value information;

a processing for format-converting the display data of the YUV format into the Y'U'V' format respectively according to the format conversion methods of the plurality of types;

a processing for switching over the output of the display data converted into the respective Y'U'V' format based on the selection of the format conversion methods, and storing the display data of the Y'U'V' format converted according to the selected format conversion method into the memory together with information for identifying the format; and a processing for recognizing the display data of the Y'U'V' format stored in the memory based on the information for identifying the format, converting the same into the RGB format for outputting it to the display panel, and outputting the display data of the RGB format by parallel/serial-converting the display data of the RGB format, wherein the format after conversion in the format conversion methods of the plurality of types comprises a first format for reducing the low order bits of the Y, U, V data of the plurality of adjacent pixels in the display data, and a second format for averaging the U and/or V data per the plurality of adjacent pixels unit.

* * * * *